US011659704B2

(12) United States Patent
Tsai

(10) Patent No.: US 11,659,704 B2
(45) Date of Patent: May 23, 2023

(54) METHOD FOR MANUFACTURING SEMICONDUCTOR STRUCTURE WITH VERTICAL GATE TRANSISTOR

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/828,270

(22) Filed: May 31, 2022

(65) Prior Publication Data

US 2022/0293604 A1   Sep. 15, 2022

Related U.S. Application Data

(62) Division of application No. 17/079,943, filed on Oct. 26, 2020, now Pat. No. 11,563,007.

(51) Int. Cl.
| | | |
|---|---|---|
| *H01L 27/10* | (2006.01) | |
| *G11C 7/18* | (2006.01) | |
| *G11C 8/14* | (2006.01) | |

(52) U.S. Cl.
CPC ............... *H10B 12/05* (2023.02); *G11C 7/18* (2013.01); *G11C 8/14* (2013.01); *H10B 12/312* (2023.02); *H10B 12/33* (2023.02); *H10B 12/482* (2023.02); *H10B 12/488* (2023.02)

(58) Field of Classification Search
CPC .. H10B 12/312; H10B 12/482; H10B 12/488; H10B 12/05; H10B 12/33; H10B 12/03; G11C 7/18; G11C 8/14; H01L 29/78642; H01L 27/10811; H01L 27/10885; H01L 27/10891; H01L 27/10873; H01L 27/1082
See application file for complete search history.

(56) References Cited

U.S. PATENT DOCUMENTS

| | | | |
|---|---|---|---|
| 8,643,087 B2 | 2/2014 | Sandhu et al. | |
| 9,698,261 B2 | 7/2017 | Wang et al. | |
| 9,698,272 B1 | 7/2017 | Ikeda et al. | |
| 10,872,894 B2 | 12/2020 | Juengling et al. | |
| 11,094,698 B2 | 8/2021 | Inaba | |
| 2013/0043525 A1 | 2/2013 | Yu et al. | |

FOREIGN PATENT DOCUMENTS

| | | |
|---|---|---|
| TW | 201601317 A | 1/2016 |
| TW | 201814885 A | 4/2018 |

OTHER PUBLICATIONS

Office Action dated Nov. 9, 2022 related to Taiwanese Application No. 110126659.
Office Action dated Aug. 4, 2022 related to U.S. Appl. No. 17/079,943, wherein this application is a Div of U.S. Appl. No. 17/079,943.

*Primary Examiner* — Shouxiang Hu
(74) *Attorney, Agent, or Firm* — Xuan Zhang

(57) ABSTRACT

The present disclosure provides a method of fabricating a semiconductor structure. The method comprises providing a substrate; forming a cell capacitor over the substrate; forming a channel material over the cell capacitor; cutting the channel material to form a channel structure, wherein the channel structure comprises a horizontal member and at least two vertical members separated by a ditch on the horizontal member; forming a lining material on sidewalls of the at least two vertical members; forming a word line to enclose the at least two vertical members encircled by the lining material, and partially fill the ditch; and forming a bit line over the channel structure.

20 Claims, 26 Drawing Sheets

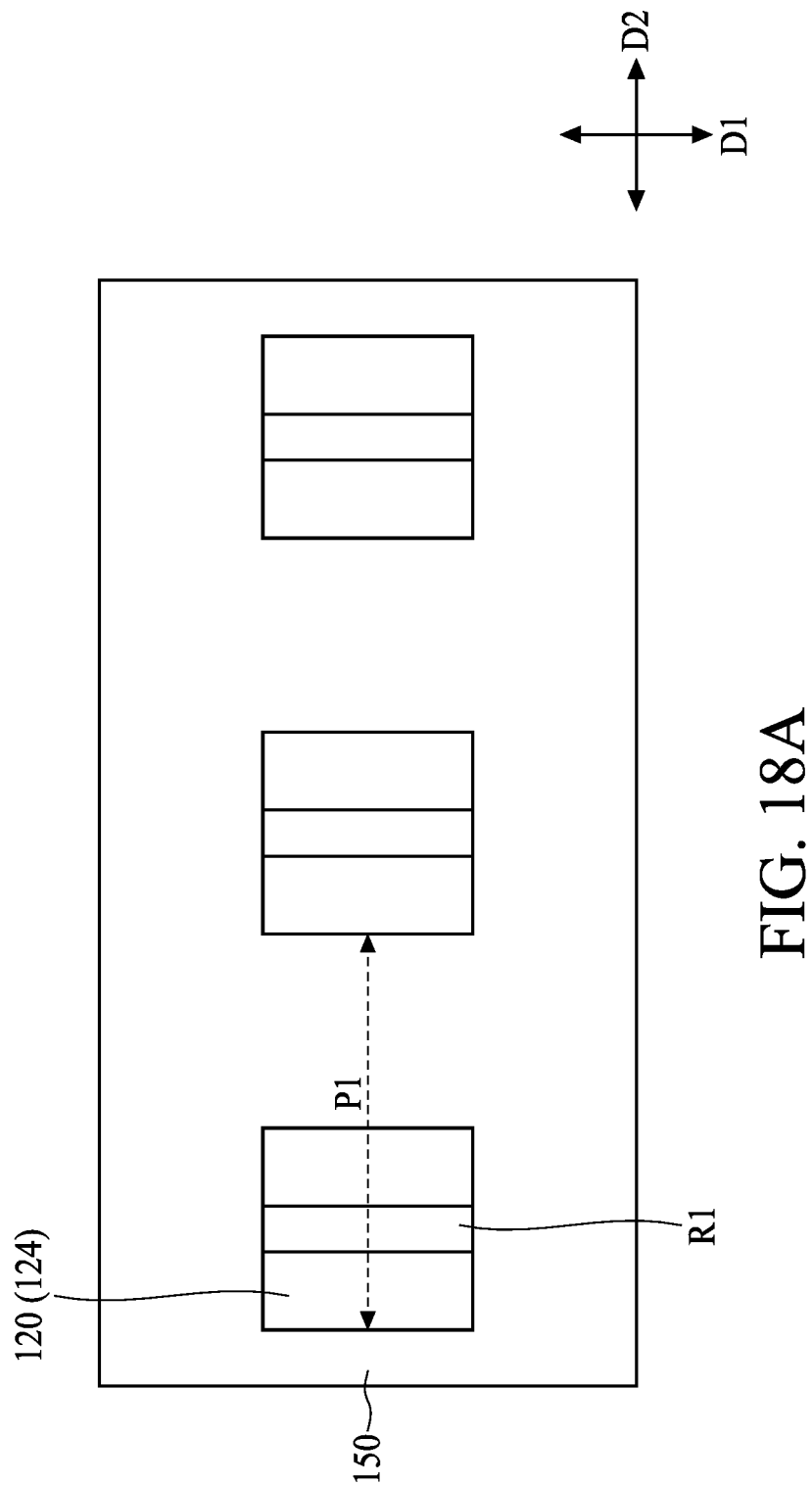

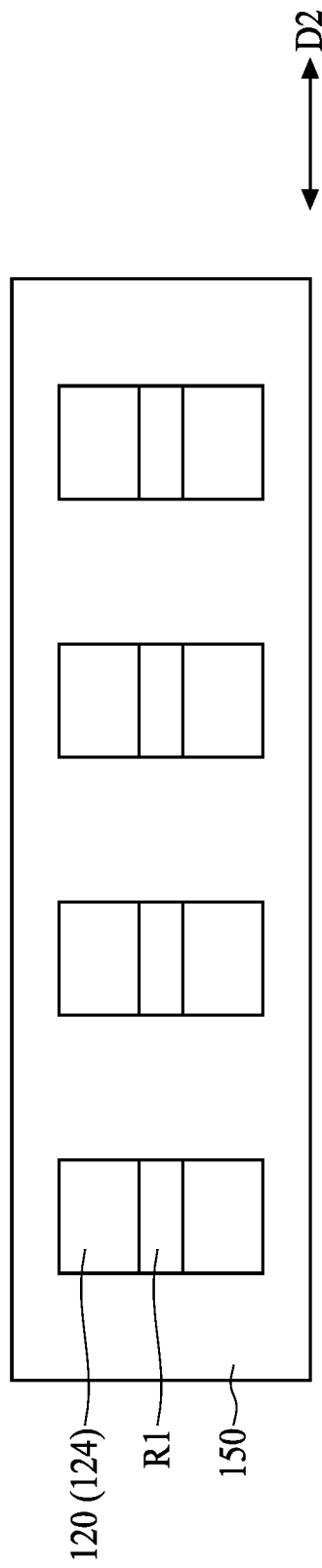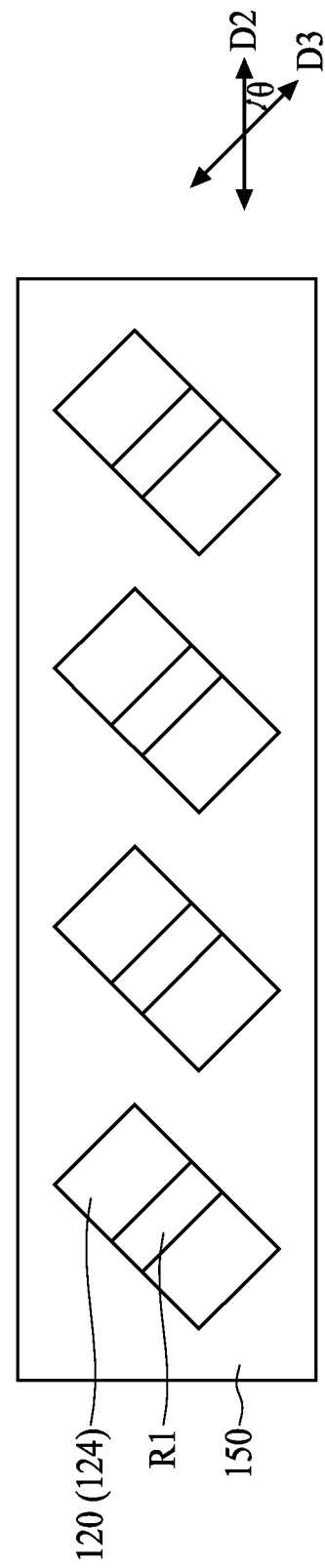

METHOD FOR MANUFACTURING SEMICONDUCTOR STRUCTURE WITH VERTICAL GATE TRANSISTOR

CROSS-REFERENCE TO RELATED APPLICATION

This application is a divisional application of U.S. Non-Provisional application Ser. No. 17/079,943 filed 26 Oct. 2020, which is incorporated herein by reference in its entirety.

TECHNICAL FIELD

The present disclosure relates to a method of manufacturing a semiconductor structure, and more particularly, to a method of manufacturing a semiconductor structure having a vertical gate transistor (VGT).

DISCUSSION OF THE BACKGROUND

A dynamic random access memory (DRAM) is a type of semiconductor arrangement for storing bits of data in separate cell capacitors within an integrated circuit. DRAMs commonly take the form of trench capacitor DRAM cells and stacked capacitor DRAM cells. In the stacked capacitor DRAM cells, the cell capacitors are formed above read/write transistors. An advanced method of fabricating the read/write transistors uses a buried gate electrode, which involves a gate electrode and a word line being built in a gate trench in an active region.

Over the past few decades, as semiconductor fabrication technology has continuously improved, sizes of electronic devices have been correspondingly reduced. As the size of a cell transistor is reduced to a few nanometers in length, short-channel effects may occur, which may result in a significant drop in the performance of the cell transistors.

To overcome the performance issue, there is a significant need to improve the fabrication method of cell transistors in a semiconductor structure.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a substrate, a cell capacitor, a channel structure, a lining material, a word line and a bit line. The cell capacitor is disposed over the substrate. The channel structure is disposed over the cell capacitor, wherein the channel structure comprises a horizontal member and at least two separated vertical members extending from the horizontal member. The lining material surrounds the at least two vertical members. The word line encloses the at least two vertical members. The bit line is disposed over the channel structure.

In some embodiments, the channel structure comprises amorphous silicon, doped silicon, indium oxide ($In_2O_3$), gallium oxide ($Ga_2O_3$), zinc oxide (ZnO), indium zinc oxide (IZO), indium tin oxide (ITO), indium tin zinc oxide (ITZO) or indium gallium zinc oxide (IGZO).

In some embodiments, the lining material includes compact silicon oxide ($SiO_2$) or silicon nitride ($Si_3N_4$).

In some embodiments, the channel structure is substantially a U-shaped structure.

In some embodiments, the at least two vertical members extend along a first direction and the word line extends along a second direction substantially orthogonal to the first direction and wherein the bit line extends along the first direction.

In some embodiments, the lining material is interposed between the word line and the channel structure.

In some embodiments, the word line passes through the at least two vertical members of the channel structure.

In some embodiments, the word line and the bit line form a memory array, wherein the memory array has a layout of four square feature size ($4F^2$).

In some embodiments, the semiconductor structure further comprises a first oxide disposed between the at least two vertical members and a second oxide disposed over the first oxide and between the at least two vertical members.

In some embodiments, the first oxide and the second oxide include silicon oxide ($SiO_2$).

In some embodiments, the lining material partially covers the first oxide, and the second oxide partially covers the lining material.

In some embodiments, a portion of the word line is sandwiched between the first oxide and the second oxide and between the at least two vertical members encircled by the lining material.

In some embodiments, the second oxide is interposed between the at least two vertical members of the channel structure.

In some embodiments, one of the at least two vertical members includes a first portion and a second portion, respectively disposed above and below the lining material.

In some embodiments, the first portion is electrically connected to the bit line and the second portion is electrically coupled to the cell capacitor via the horizontal member.

In some embodiments, the word line is interposed between the first portion and the second portion and electrically coupled to the bit line and the cell capacitor via the channel structure.

One aspect of the present disclosure provides a semiconductor structure. The semiconductor structure comprises a substrate, a bit line, a channel structure, a lining material, a word line and a cell capacitor. The bit line is disposed over the substrate. The channel structure is disposed over the bit line, wherein the channel structure comprises a horizontal member and at least two separated vertical members extending from the horizontal member. The lining material surrounds the at least two vertical members. The word line encloses the at least two vertical members. The cell capacitor is disposed over the channel structure.

Another aspect of the present disclosure provides a method of fabricating a semiconductor structure. The method comprises providing a substrate; forming a cell capacitor over the substrate; forming a channel material over the cell capacitor; cutting the channel material to form a channel structure, wherein the channel structure comprises a horizontal member and at least two vertical members separated by a ditch on the horizontal member; forming a lining material on sidewalls of the at least two vertical members; forming a word line to enclose the at least two vertical members encircled by the lining material, and partially fill the ditch; and forming a bit line over the channel structure.

In some embodiments, after the forming of the channel structure, a first oxide is formed in the ditch.

In some embodiments, after the forming of the word line, a second oxide is formed on the word line in the ditch and over the first oxide.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 18A to 18C are schematic plan views of a plurality of channel structures coupled by a word line, in accordance with some embodiments of the present disclosure.

DETAILED DESCRIPTION

Figure 1A:
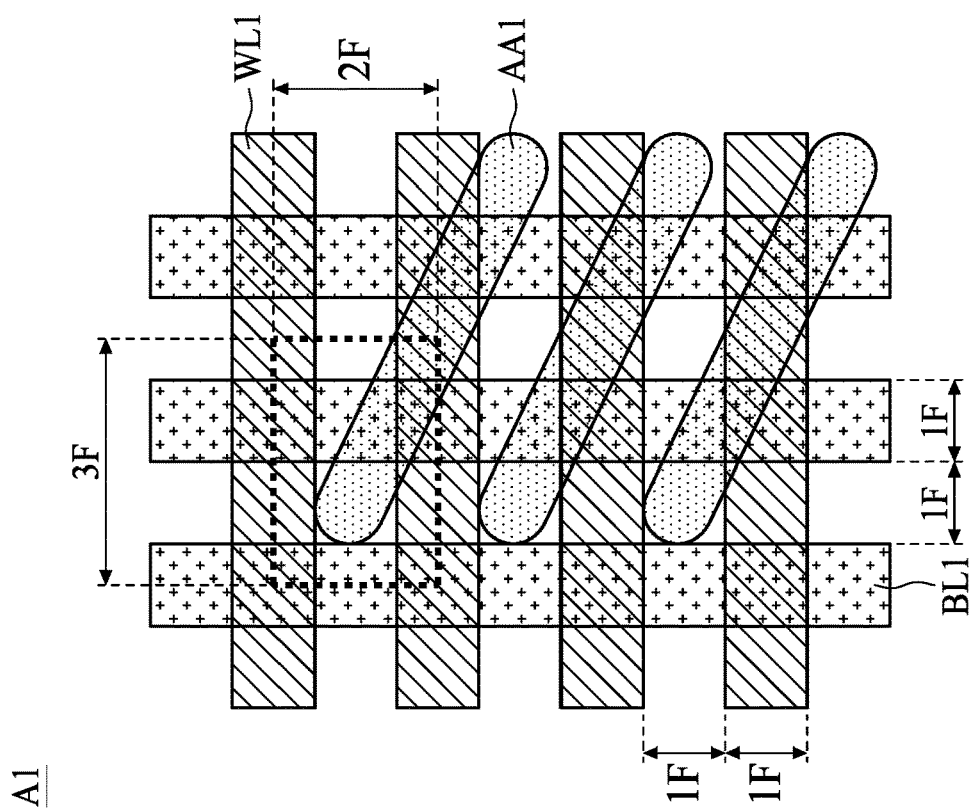
FIG. 1A is a schematic top plan view of a portion of a first memory array with a $6F^2$ layout, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dynamic random access memory (DRAM) has been developed to overcome inherent scaling limitations and to improve cost effectiveness of mass production. Scaling down of the DRAM has been remarkably advanced by adoption of a trench capacitor structure and a stacked capacitor structure. A size of a unit memory cell with one cell transistor and one cell capacitor has been reduced by evolution of a layout of a memory array from a six square feature size ($6F^2$) to a four square feature size ($4F^2$). Specifically, the minimum feature size F decreases with a new generation, and when the cell size is generally taken to be $\alpha F^2$, $\alpha$ is a coefficient that also decreases with the advance of generation.

The main difference between the $6F^2$ and $4F^2$ layouts is that the $4F^2$ cell structure is implemented using a vertical transistor, while the $6F^2$ cell structure is implemented using a buried-channel-array transistor (BCAT). The $4F^2$ cell is a promising architecture for cost-effective and scalable DRAM chips because of its minimized area of cells. Due to the design of the vertical transistor, the $4F^2$ cell can be implemented in an area that is 33% smaller than that of the $6F^2$ cell; thus, the area of a memory cell array is reduced. The vertical transistor demonstrates excellent retention characteristics in static mode. However, the $4F^2$ DRAM cell has significant disadvantages: the complicated integration process required for structure formation and the occurring of a floating body effect (FBE) due to vertical transistors.

In silicon on insulator (SOI) technology, an FBE is a phenomenon in which a threshold voltage ($V_{th}$) of a transistor varies because a body of the transistor does not have a certain fixed voltage value during operation. When the gate of the transistor is turned off, a potential well is formed in the body region. Electron/hole pairs are generated by gate-induced drain leakage (GIDL) in the junction region and the generated holes accumulate in the body potential well. In other words, the threshold voltage of the transistor depends on the history of its biasing and carrier recombination processes. The FBE causes voltage fluctuation in a body region of an SOI metal-oxide semiconductor field-effect transistor (MOSFET), which results in detrimental effects on operation of SOI devices. The most common of these detrimental effects are the kink effect and the bipolar effect. With a channel region of the device partially depleted and a high drain voltage applied, an electric field created in the device causes impact ionization near a drain region.

To avoid the FBE and to decrease the current leakage in transistors for low-power applications, non-silicon-based materials show high potential when used in the $4F^2$ cell structure because of their intrinsically high band gap. However, high-temperature processes might impact electrical properties of the non-silicon-based materials. For example, many non-silicon-based materials are heat sensitive and may be degraded by the high-temperature processes. Fabrication of a cell capacitor generally includes several high-temperature processes.

Therefore, when the heat-sensitive non-silicon-based materials are used in the fabrication of cell transistors, processes of the cell capacitor and the cell transistor should be separated and a capacitor-first process should be adopted. However, practical use is not easy since there is technical difficulty in that in $4F^2$ DRAMs the cell transistor must be a vertical type. As a result, there is still a significant need to improve the fabricating method of a vertical transistor.

FIG. 1A is a schematic top plan view of a portion of a first memory array A1 with a $6F^2$ layout, in accordance with some embodiments of the present disclosure. In FIG. 1A, multiple word lines WL1 are orthogonal to multiple bit lines BL1. In some embodiments, a width of each word line WL1 and a width of each bit line BL1 are 1F, wherein F is a minimum feature size. In some embodiments, a distance between any two adjacent word lines WL1 and a distance between any two adjacent bit lines BL1 are also 1F. In the $6F^2$ layout, an active region AA1 is diagonally disposed with respect to the extending direction of the word line WL1 or the bit line BL1. In the active region AA1, multiple memory cells (not shown) located at the intersection of the word line WL1 and the bit line BL1 are electrically coupled to the word line WL1 and the bit line BL1. Therefore, the area of a unit memory cell in FIG. 1A is about $3F \times 2F = 6F^2$, as shown by the rectangular dashed line.

Figure 1B:
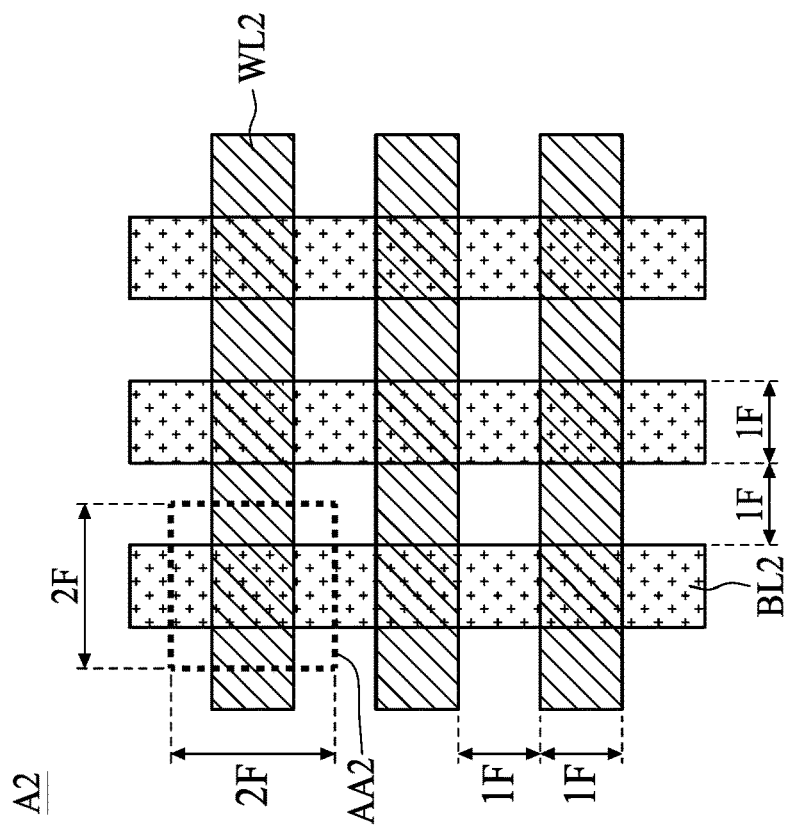
FIG. 1B is a schematic top plan view of a portion of a second memory array with a $4F^2$ layout, in accordance with some embodiments of the present disclosure.

FIG. 1B is a schematic top plan view of a portion of a second memory array A2 with a $4F^2$ layout, in accordance with some embodiments of the present disclosure. In FIG. 1B, multiple word lines WL2 are orthogonal to multiple bit lines BL2. In some embodiments, a width of each word line WL2 and a width of each bit line BL2 are 1F. In some embodiments, a distance between any two adjacent word lines WL2 and a distance between any two adjacent bit lines BL2 are also 1F. In the $4F^2$ layout, an active region AA2 is disposed at the intersection of the word line WL2 and the bit line BL2. In addition, a unit memory cell (not shown) is located in the active region AA2 and electrically coupled to the word line WL2 and the bit line BL2. Therefore, the area of the unit memory cell in FIG. 1B is about $2F \times 2F = 4F^2$, as shown by the square dashed line.

Figure 2A:
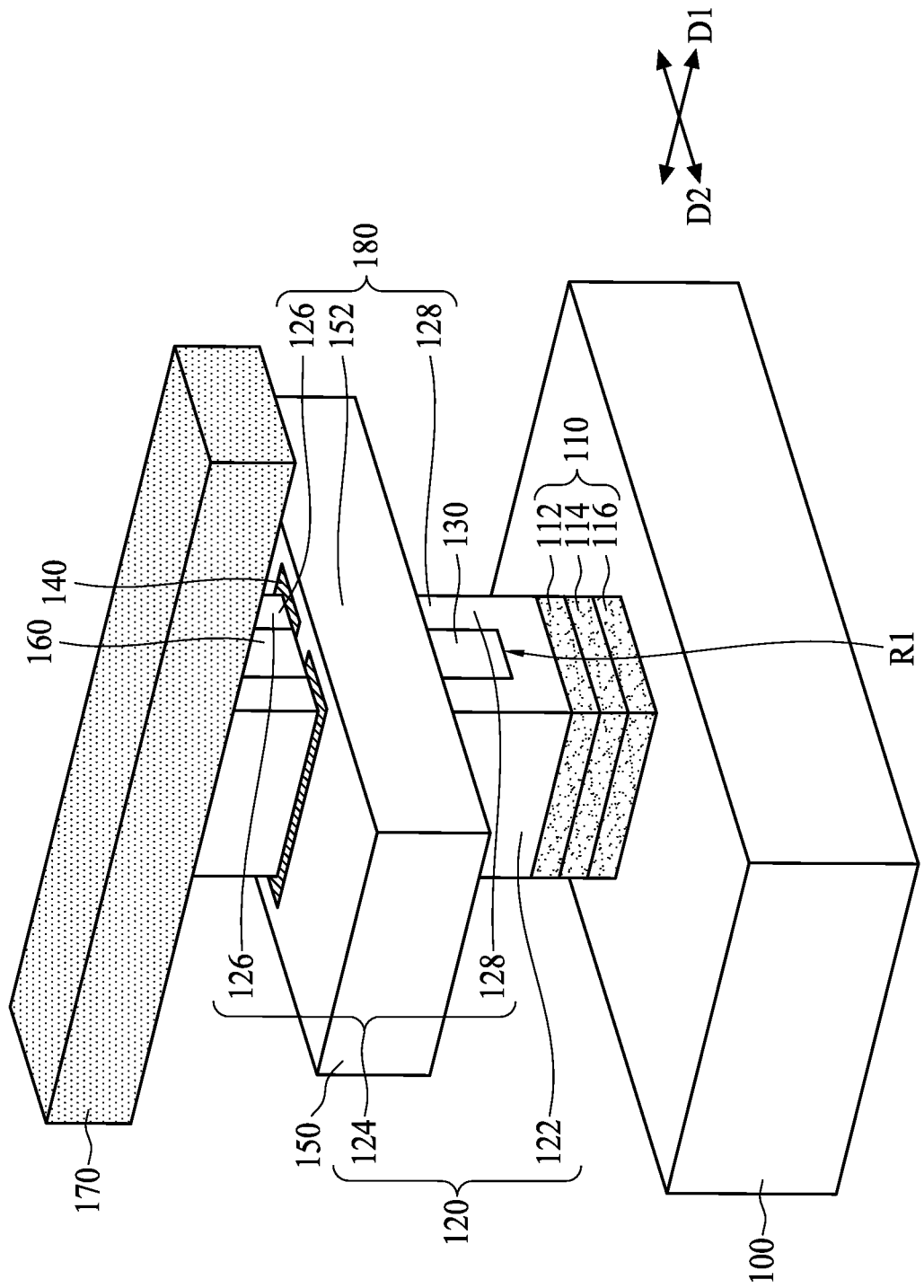
FIG. 2A is a schematic perspective view of a first semiconductor structure, in accordance with some embodiments of the present disclosure.

One aspect of the present disclosure provides a first semiconductor structure. FIG. 2A is a schematic perspective view of a first semiconductor structure 200, in accordance with some embodiments of the present disclosure. In some embodiments, the first semiconductor structure 200 includes a vertical gate transistor (VGT). Specifically, the first semiconductor structure 200 includes a substrate 100, a cell capacitor 110, a channel structure 120, a first oxide 130, a lining material 140, a word line 150, a second oxide 160 and a bit line 170. The cell capacitor 110 is disposed over the substrate 100. The channel structure 120 is disposed over the cell capacitor 110, wherein the channel structure 120 is substantially a U-shaped structure including a horizontal member 122 and a pair of vertical members 124 on the horizontal member 122. A ditch R1 separates the pair of vertical members 124 and extends along a first direction D1. In some embodiments, the pair of vertical members 124 extend along the same direction as the ditch R1. The first oxide 130 is disposed on the horizontal member 122 and between the pair of vertical members 124 of the channel structure 120. The lining material 140 encircles a portion of each of the vertical members 124 and partially covers the first oxide 130. The word line 150 encloses a portion of each of the vertical members 124 encircled by the lining material 140 and partially fills the ditch R1. The word line 150 is disposed to cover the first oxide 130 and partially fill the ditch R1.

In addition, the word line 150 passes through the vertical members 124 and extends along a second direction D2 substantially orthogonal to the first direction D1. The second oxide 160 is disposed on the word line 150 in the ditch R1 and over the first oxide 130 within the channel structure 120. The second oxide 160 also covers a portion of the lining material 140 in the ditch R1. A portion of the word line 150 is sandwiched between the first oxide 130 and the second oxide 160 and between the pair of vertical members 124 encircled by the lining material 140. The bit line 170 is disposed over the channel structure 120 and extends along the first direction D1.

Still referring to FIG. 2A, in the first semiconductor structure 200, the vertical member 124 of the channel structure 120 includes a first portion 126 and a second portion 128, respectively disposed above and below the lining material 140. In some embodiments, the first portion 126 may function as either a source or drain terminal, and the second portion 128 may function as either a source or drain terminal. That is, when the first portion 126 functions as either a source terminal, the second portion 128 functions as a drain terminal, and vice versa. In addition, a portion of the word line 150 can function as a gate terminal. Therefore, the first portion 126, the second portion 128 and a portion of the word line 150 may form a vertical transistor.

In addition, the lining material 140 may function as a gate dielectric layer that separates the gate terminal of the vertically-oriented transistor from the underlying source and drain terminals. The first portion 126 is electrically connected to the bit line 170 and the second portion 128 is electrically coupled to the cell capacitor 110 via the horizontal member 122. In addition, the word line 150 is interposed between the first portion 126 and the second portion 128 and electrically coupled to the bit line 170 and the cell capacitor 110 via the channel structure 120. The word line 150 and the bit line 170 can form a memory array with a layout of four square feature size ($4F^2$).

Figure 2B:
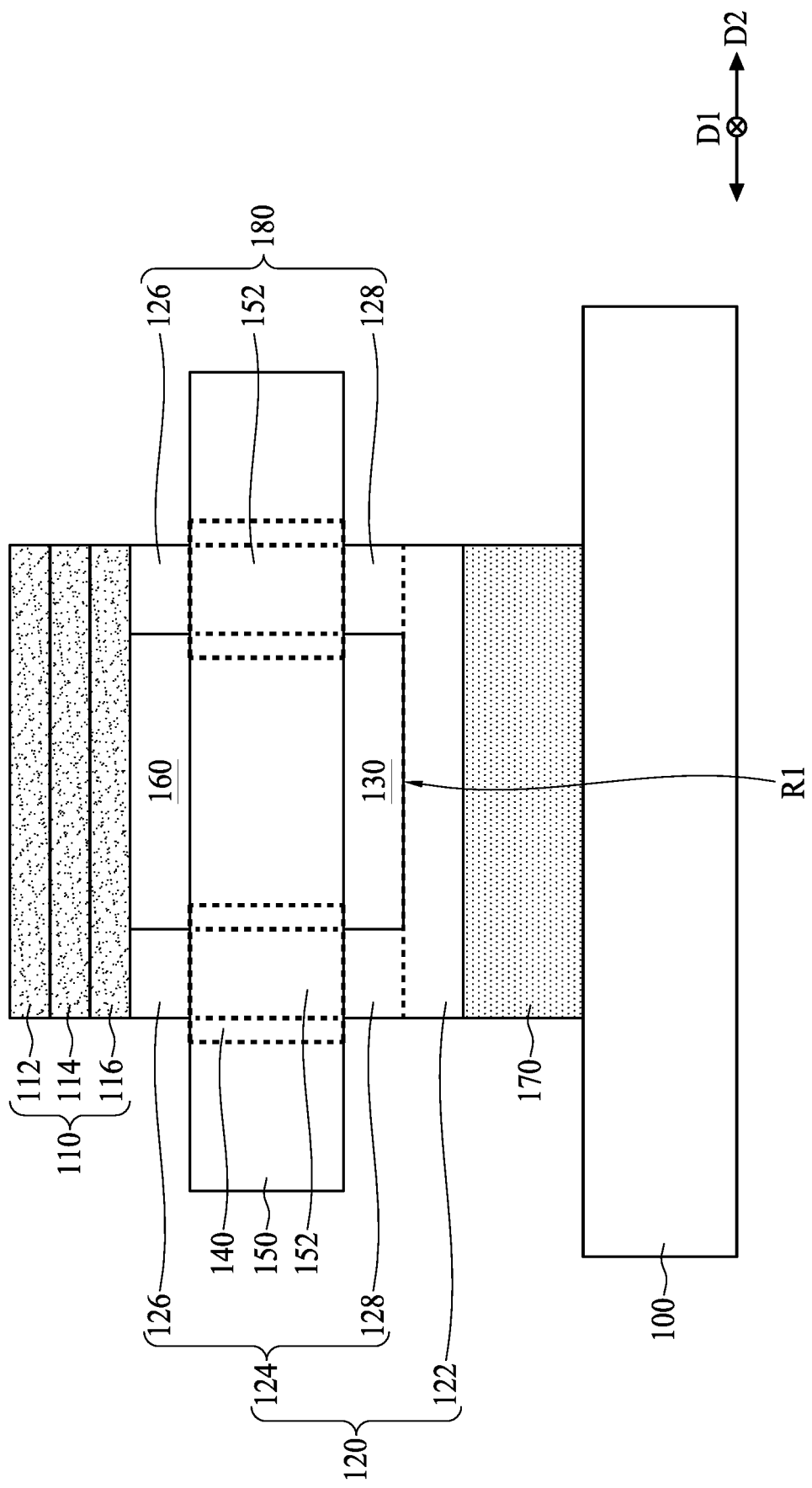
FIG. 2B is a schematic cross-sectional view of a second semiconductor structure, in accordance with some embodiments of the present disclosure.

Another aspect of the present disclosure provides a second semiconductor structure. FIG. 2B is a schematic cross-sectional view of a second semiconductor structure 300, in accordance with some embodiments of the present disclosure. In some embodiments, the second semiconductor structure 300 also includes a VGT. The second semiconductor structure 300 is similar to the first semiconductor structure 200, except the bit line 170 is formed prior to the formation of the cell capacitor 110. At such time, the bit line 170 is formed on the substrate 100 and the cell capacitor 110 is located over the intersection of the word line 150 and the bit line 170.

Figure 3:
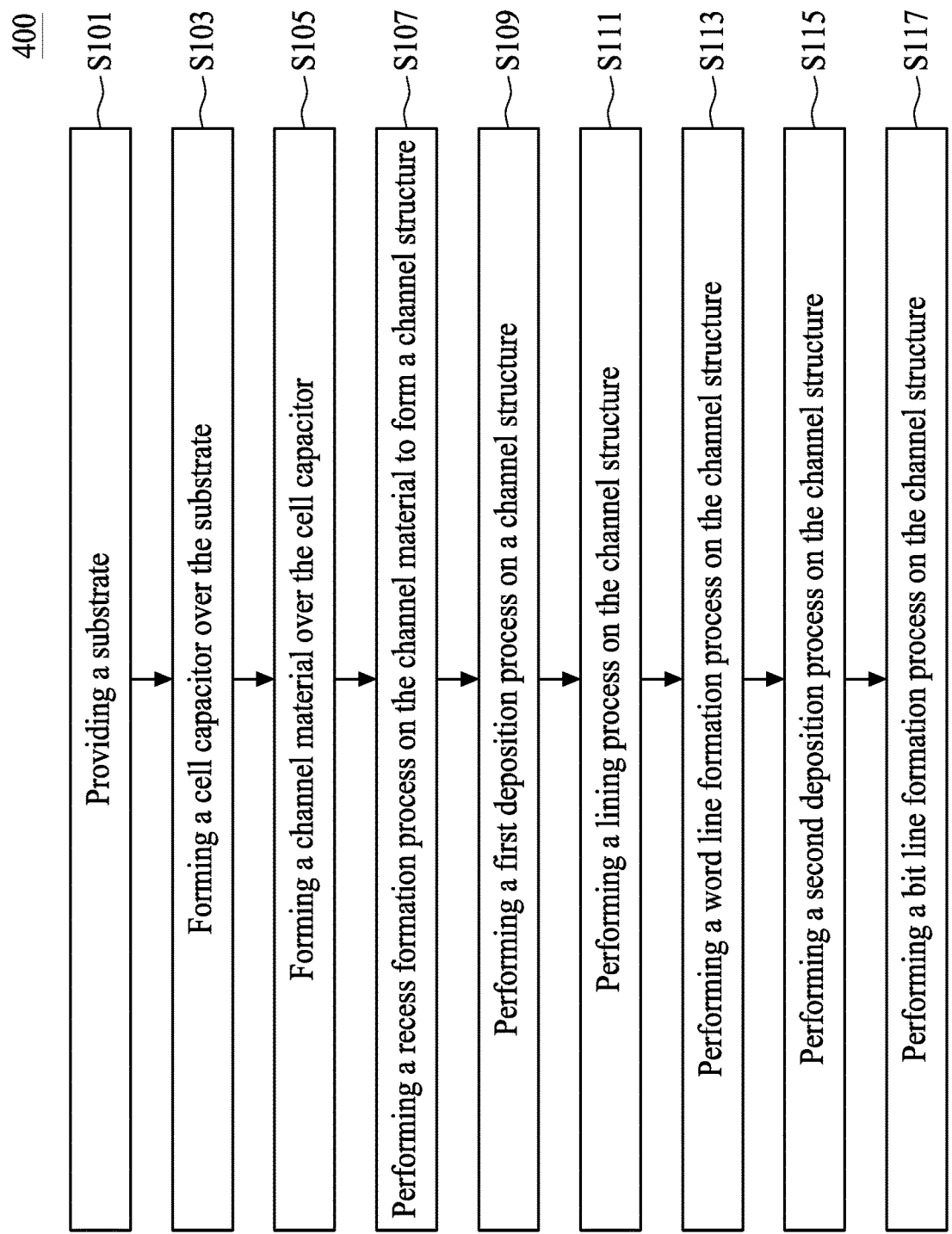
FIG. 3 is a flow diagram showing a method for fabricating the first semiconductor structure in FIG. 2A, in accordance with some embodiments of the present disclosure.

Still another aspect of the present disclosure provides a method for fabricating a semiconductor structure. FIG. 3 is a flow diagram showing a method 400 for fabricating the first semiconductor structure 200 in FIG. 2A, in accordance with some embodiments of the present disclosure. In some embodiments, the method 400 is a capacitor-first process, i.e., a cell capacitor is formed prior to the formation of a bit line. FIGS. 4 to 5, 7 to 9, 11, 13 to 14, 16, 19 and 21 are schematic cross-sectional views showing sequential fabrication stages according to the method in FIG. 3, in accordance with some embodiments of the present disclosure.

Figure 4:
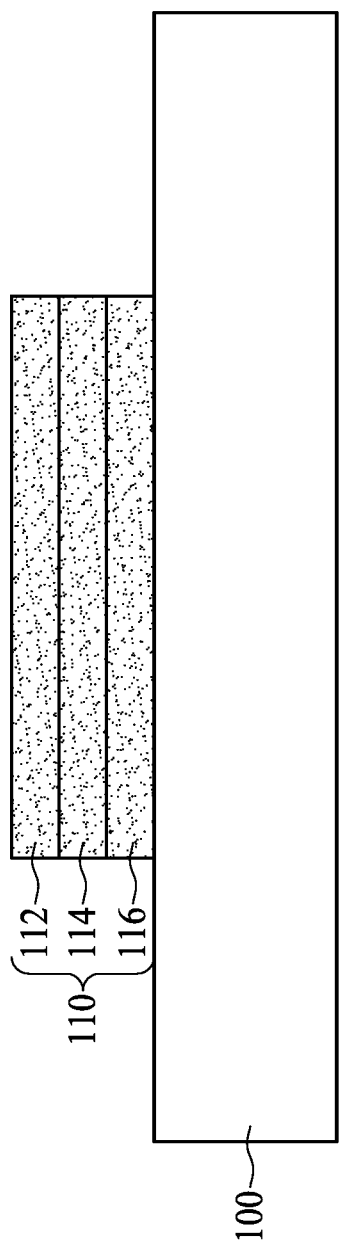
FIGS. 4 to 5 are schematic cross-sectional views showing sequential fabrication stages according to the method in FIG. 3, in accordance with some embodiments of the present disclosure.

With reference to FIG. 4, a substrate 100 is provided according to step S101 in FIG. 3. In some embodiments, the substrate 100 can be a single crystal silicon substrate, a polysilicon substrate, a compound semiconductor substrate such as a silicon germanium (SiGe) substrate, a gallium arsenide (GaAs) substrate, a silicon-on-insulator (SOI) substrate or any other suitable substrate.

Still referring to FIG. 4, a cell capacitor 110 is formed over the substrate 100 according to step S103 in FIG. 3. The cell capacitor 110 is used to store a charge, which represents a bit of information. In some embodiments, the cell capacitor 110 is electrically coupled to the substrate 100 via multiple landing pads (not shown). In addition, the material of the landing pads includes tungsten (W), copper (Cu), aluminum (Al) or alloys thereof, but is not limited thereto.

It should be understood that the cell capacitor 110 shown in FIG. 4 is for illustration purpose only and the detailed architecture of the cell capacitor 110 is not shown. In some embodiments, the cell capacitor 110 at least includes a top electrode 112, a capacitor dielectric 114 and a bottom electrode 116. The capacitor dielectric material 114 is encased by the top electrode 112 and the bottom electrode 116. In some embodiments, the top electrode 112 and the bottom electrode 116 may be a conductor, such as a metal, alloy or polysilicon. The capacitor dielectric material 114 may be formed with one or more high-k dielectric materials, such as hafnium oxide ($HfO_2$), zirconium oxide ($ZrO_2$), tantalum oxide ($Ta_2O_5$), aluminum oxide ($Al_2O_3$) or the like. In some embodiments, the cell capacitor 110 may be any shape of capacitor known in the art. For example, the shape of the cell capacitor 110 can be simple, such as a rectangle, or complex, such as concentric cylinders or stacked discs.

In some embodiments, the capacitor 110 can be surrounded by an interlayer dielectric (not shown) deposited on the substrate 100. In some embodiments, the interlayer dielectric mainly includes oxide such as silicon oxide ($SiO_2$), tetraethyl orthosilicate (TEOS), boron phosphorus silicate glass (BPSG), undoped silicate glass (USG) or other suitable materials. In some embodiments, the interlayer dielectric can be formed in order accompanying the steps of the method 200 according to practical process requirements. In addition, the height of the interlayer dielectric can be controlled to selectively expose an element. In the present disclosure, the interlayer dielectric is not shown in the figures for clarity.

Figure 5:
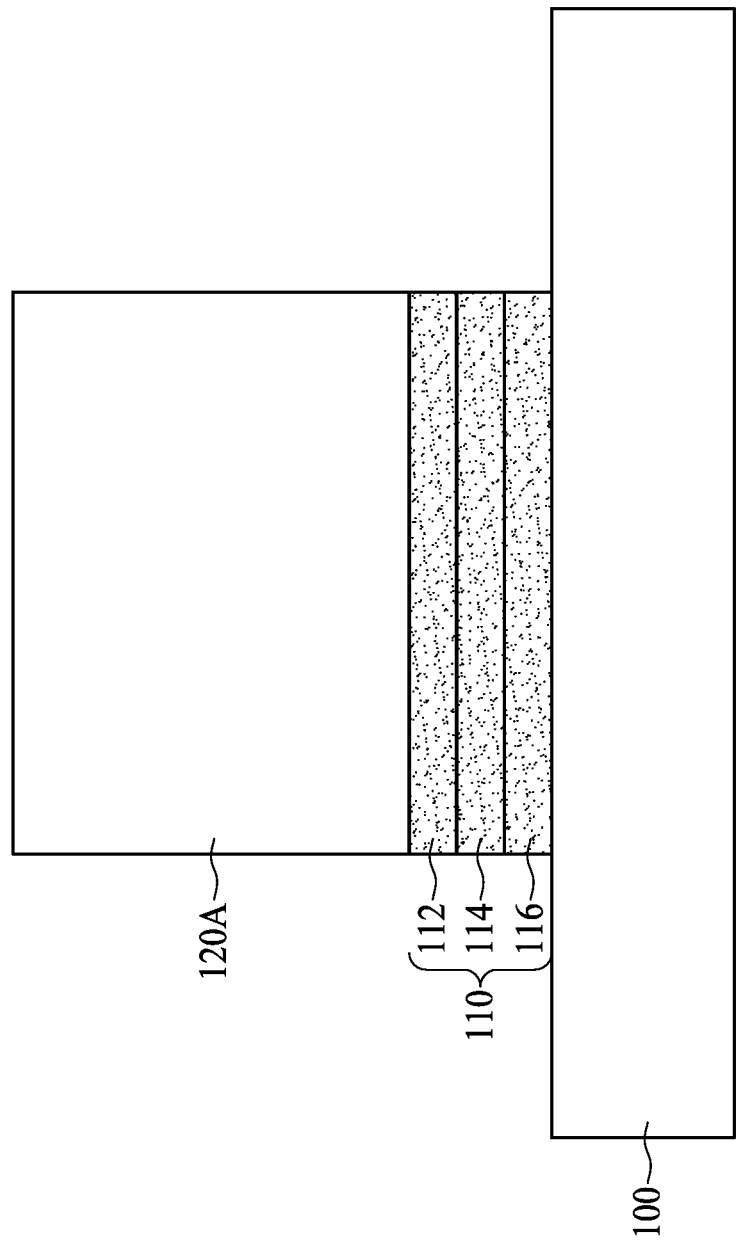

With reference to FIG. 5, a channel material 120A is formed over the cell capacitor 110 according to step S105 in FIG. 3. Specifically, the channel material 120A is formed using methods such as a sputtering process, a physical vapor deposition (PVD) process or a chemical vapor deposition (CVD) process. In some embodiments, the channel material 120A includes amorphous silicon, doped silicon, metal-oxide semiconductors such as indium oxide ($In_2O_3$), gallium oxide ($Ga_2O_3$), zinc oxide (ZnO), indium zinc oxide (IZO), indium tin oxide (ITO), indium tin zinc oxide (ITZO) or indium gallium zinc oxide (IGZO), but is not limited thereto.

Figure 6B:
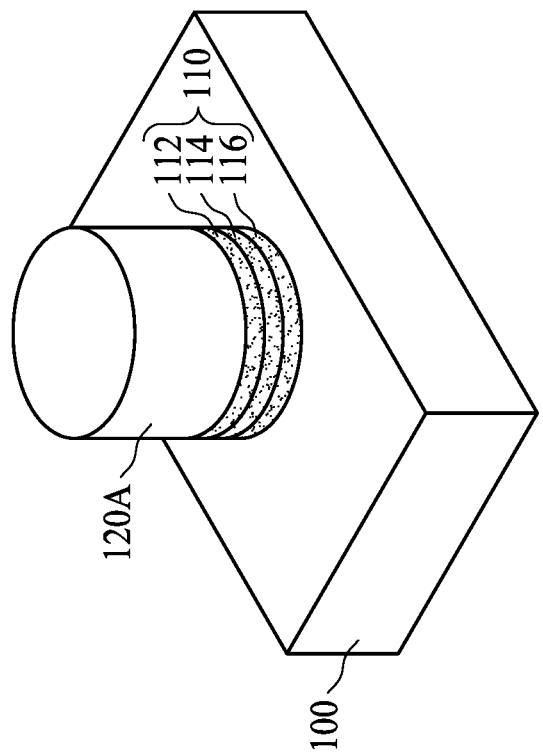
FIG. 6B is a schematic perspective view of FIG. 5, in accordance with other embodiments of the present disclosure.
Figure 6A:
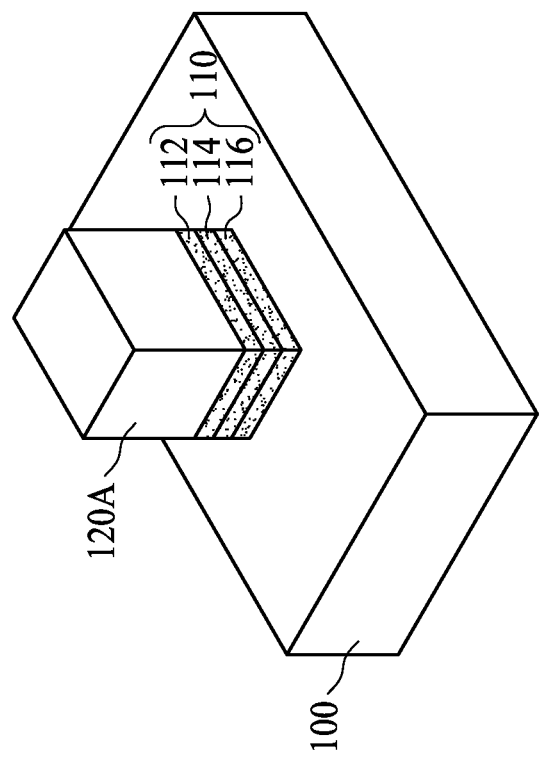
FIG. 6A is a schematic perspective view of FIG. 5, in accordance with some embodiments of the present disclosure.

FIG. 6A is a schematic perspective view of FIG. 5, in accordance with some embodiments of the present disclosure. In some embodiments, the shape of the channel material 120A is a square column, a rectangular column or a polygonal column. The channel material 120A shown in FIG. 6A covers the cell capacitor 110 interposed between the channel material 120A and the substrate 100. In other embodiments, the shape of the channel material 120A can be a cylinder, as shown in FIG. 6B.

Figure 7:
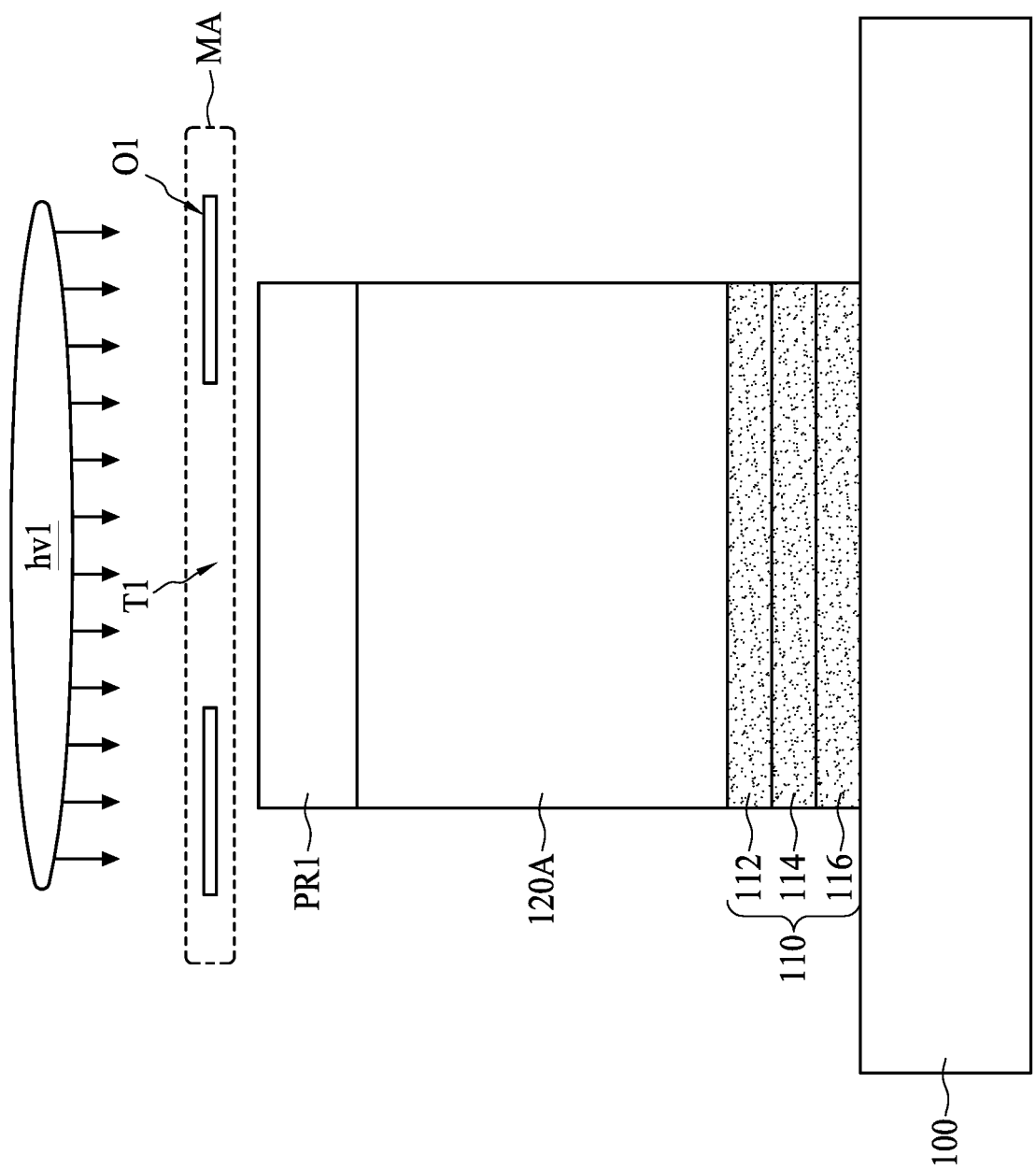
FIGS. 7 to 9 are schematic cross-sectional views showing sequential fabrication stages according to the method in FIG. 3, in accordance with some embodiments of the present disclosure.
Figure 8:
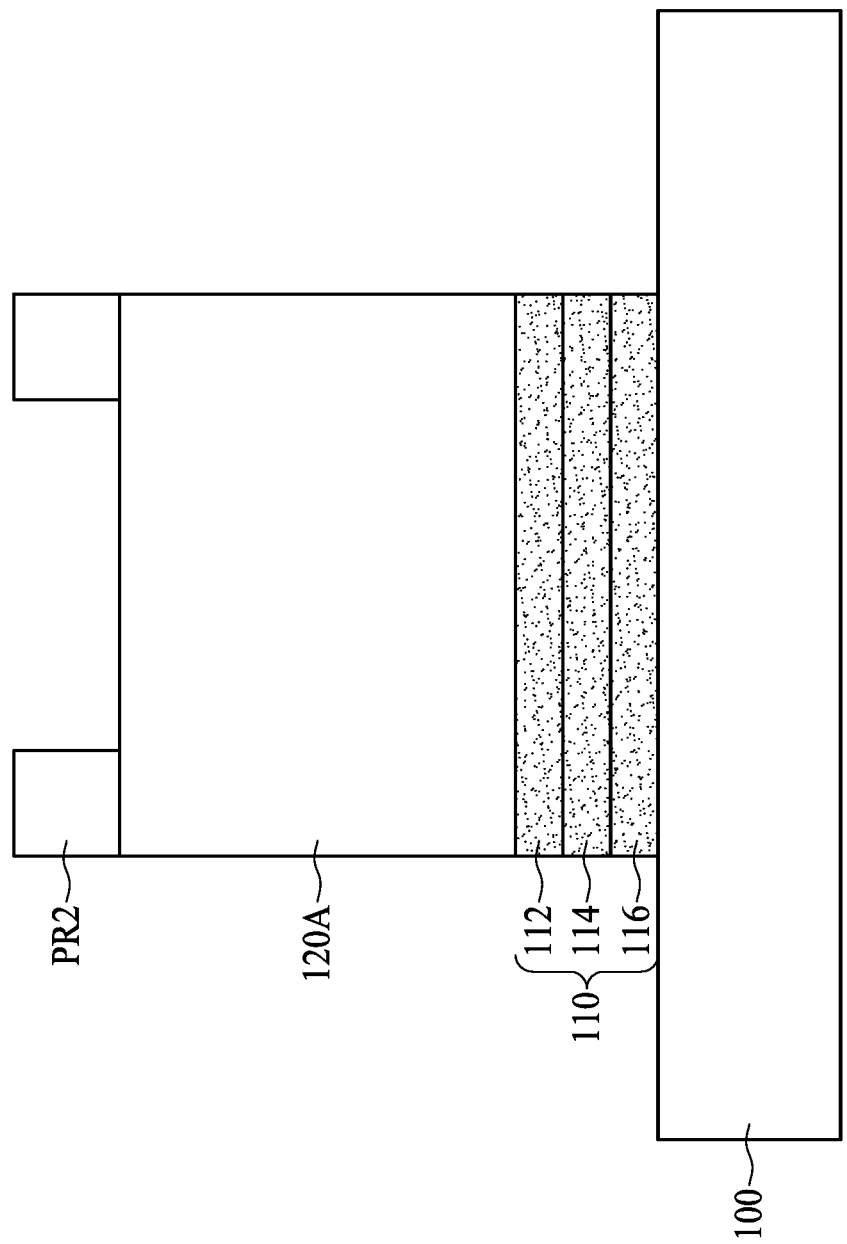
Figure 9:
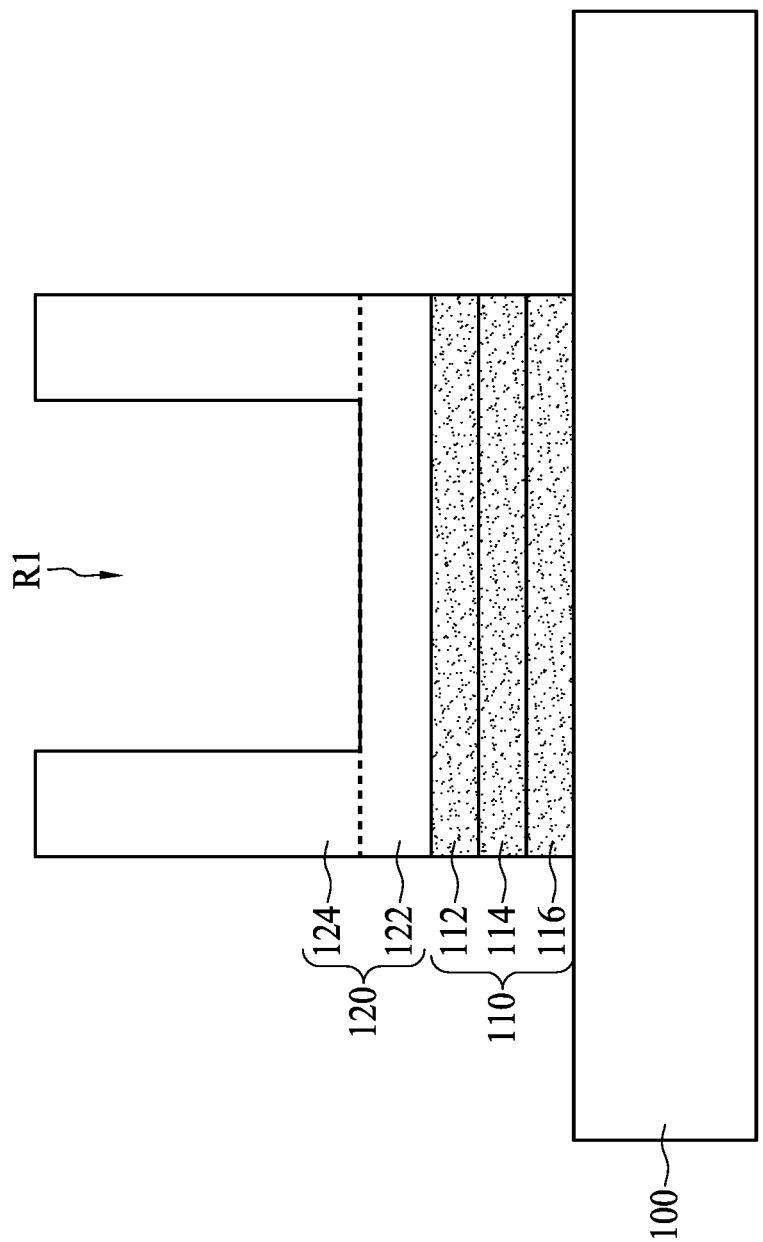

With reference to FIGS. 7 to 9, a recess formation process is performed on the channel material 120A according to step S107 in FIG. 3. Referring to FIG. 7, a photoresist layer PR1 is formed on the channel material 120A. In some embodiments, the photoresist layer PR1 is a positive tone photoresist (positive photoresist), which is characterized by removal of exposed regions using a developing agent. In some embodiments, the photoresist layer PR1 includes chemical amplifier (CA) photoresist. The CA photoresist includes a photo acid generator (PAG) that can be decomposed to form acids during a lithography exposure process. More acids can be generated as a result of a catalytic reaction.

Still referring to FIG. 7, a lithography process is performed on the photoresist layer PR1. The photoresist layer PR1 is exposed to a radiation hv1 using a photomask MA and a lithography system (not shown). In some embodiments, the radiation hv1 may include, but is not limited to, deep ultraviolet (DUV) radiation. The photomask MA includes a transparent portion T1 and an opaque portion O1. In some embodiments, the photomask MA may be a binary mask, a phase shift mask or any other type of mask suitable for use in the lithography system. The exposure induces a photochemical reaction that changes the chemical property of portions of the photoresist layer PR1. For example, portions of the photoresist layer PR1 corresponding to the transparent portions T1 are exposed and become more reactive to a developing process. In some embodiments, a post-exposure baking (PEB) may be performed after the photoresist layer PR1 is exposed.

Next, referring to FIG. 8, an appropriate developing agent is used to rinse the exposed photoresist layer PR1. In some embodiments, exposed portions of the photoresist layer PR1 are reacted with the developing agent and can be easily removed. After the exposed photoresist layer PR1 is developed, a photoresist pattern PR2 is formed on the channel material 120A.

Subsequently, referring to FIG. 9, the channel material 120A is etched using the photoresist pattern PR2 as an etching mask. In some embodiments, the etching process is an RIE process, which vertically removes a portion of the channel material 120A. At such time, a ditch R1 is formed to cut the channel material 120A, thus forming a channel structure 120. The photoresist pattern PR2 is then removed using methods such as an ashing process or a wet strip process. In some embodiments, the channel structure 120 is substantially a U-shaped structure which includes a horizontal member 122 and a pair of vertical members 124 located on the horizontal member 122. In addition, the ditch R1 is also included in the channel structure 120. In some embodiments, the vertical member 124 and the ditch R1 extend along a first direction D1.

Figure 10B:
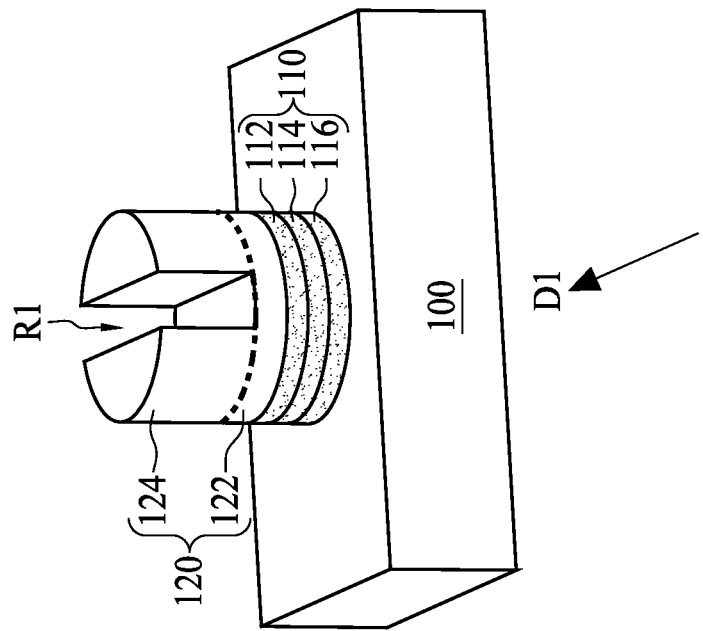
FIG. 10B is a schematic perspective view of FIG. 9, in accordance with other embodiments of the present disclosure.
Figure 10A:
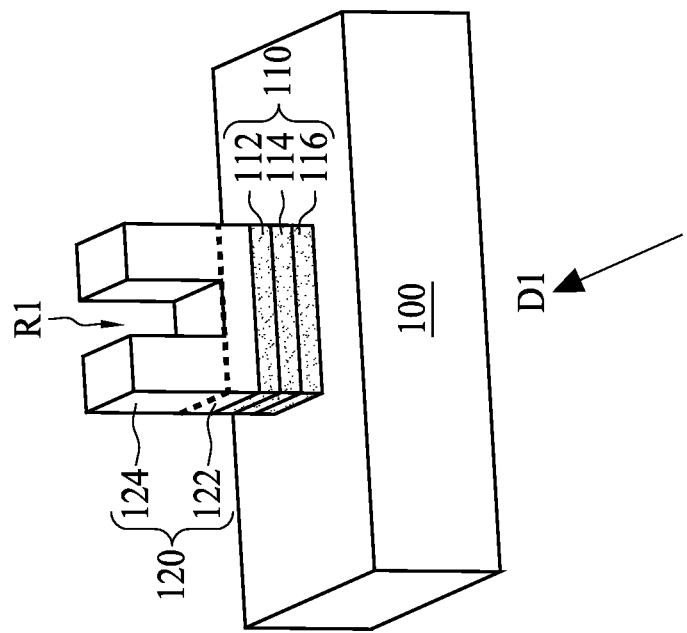
FIG. 10A is a schematic perspective view of FIG. 9, in accordance with some embodiments of the present disclosure.

FIG. 10A is a schematic perspective view of FIG. 9, in accordance with some embodiments of the present disclosure. In some embodiments, the vertical members 124 separated by the ditch R1 are basically rectangular columns. In other embodiments, when the recess formation process is performed on the cylindrical channel material 120A, as shown in FIG. 6B, the formed vertical members 124 will be nearly semicircular columns separated by the ditch R1, as shown in FIG. 10B. In some embodiments, the two vertical members 122 are evenly divided by the ditch R1, i.e., the two vertical members 122 are of the same size. In other embodiments, the two vertical members 122 can be of different sizes.

Figure 11:
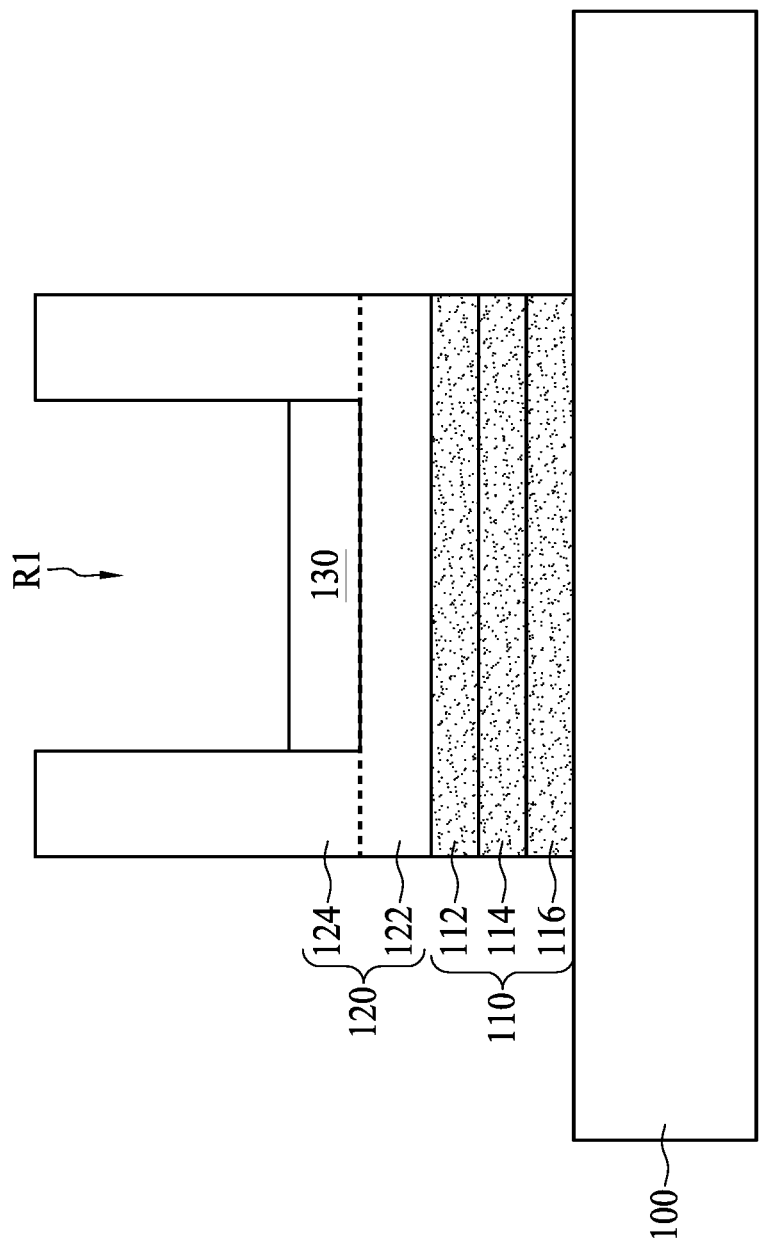
FIG. 11 is a schematic cross-sectional view showing a sequential fabrication stage according to the method in FIG. 3, in accordance with some embodiments of the present disclosure.

With reference to FIG. 11, a first deposition process is performed on the channel structure 120 according to step S109 in FIG. 3. In some embodiments, a first oxide 130 is formed to partially fill the ditch R1. Specifically, the first oxide 130 is deposited on the horizontal member 122 and between the vertical members 124 of the channel structure 120. The first oxide 130 may be formed using methods such as a low-pressure chemical vapor deposition (LPCVD) process or a plasma-enhanced chemical vapor deposition (PECVD) process. In some embodiments, the first oxide 130 is silicon oxide ($SiO_2$). In some embodiments, the first oxide 130 provides additional oxygen atoms to the channel structure 120 via the formation of metal-oxygen (M-O) bonds between the channel structure 120 and the first oxide 130.

Figure 12:
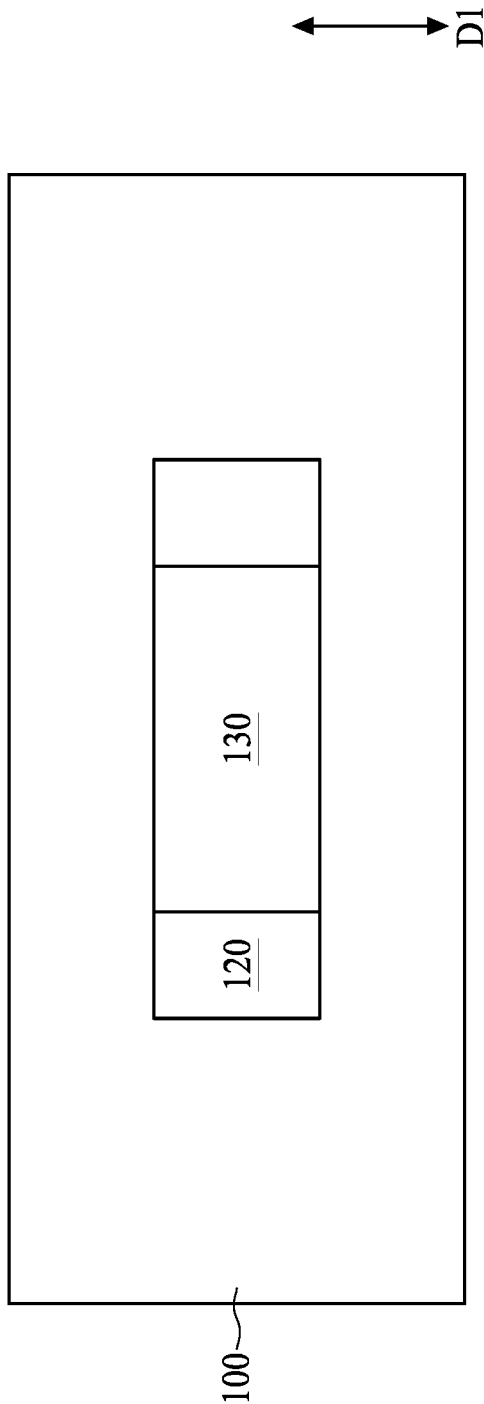
FIG. 12 is a schematic plan view of FIG. 11, in accordance with some embodiments of the present disclosure.

FIG. 12 is a schematic plan view of FIG. 11, in accordance with some embodiments of the present disclosure. In some embodiments, the first oxide 130 is in the form of a rectangular column centrally disposed within the channel structure 120. The first oxide 130 is aligned with the vertical member 124. In FIG. 12, the cell capacitor 110 is interposed between the channel structure 120 and the substrate 100, and thus is not shown in the plan view.

Figure 13:
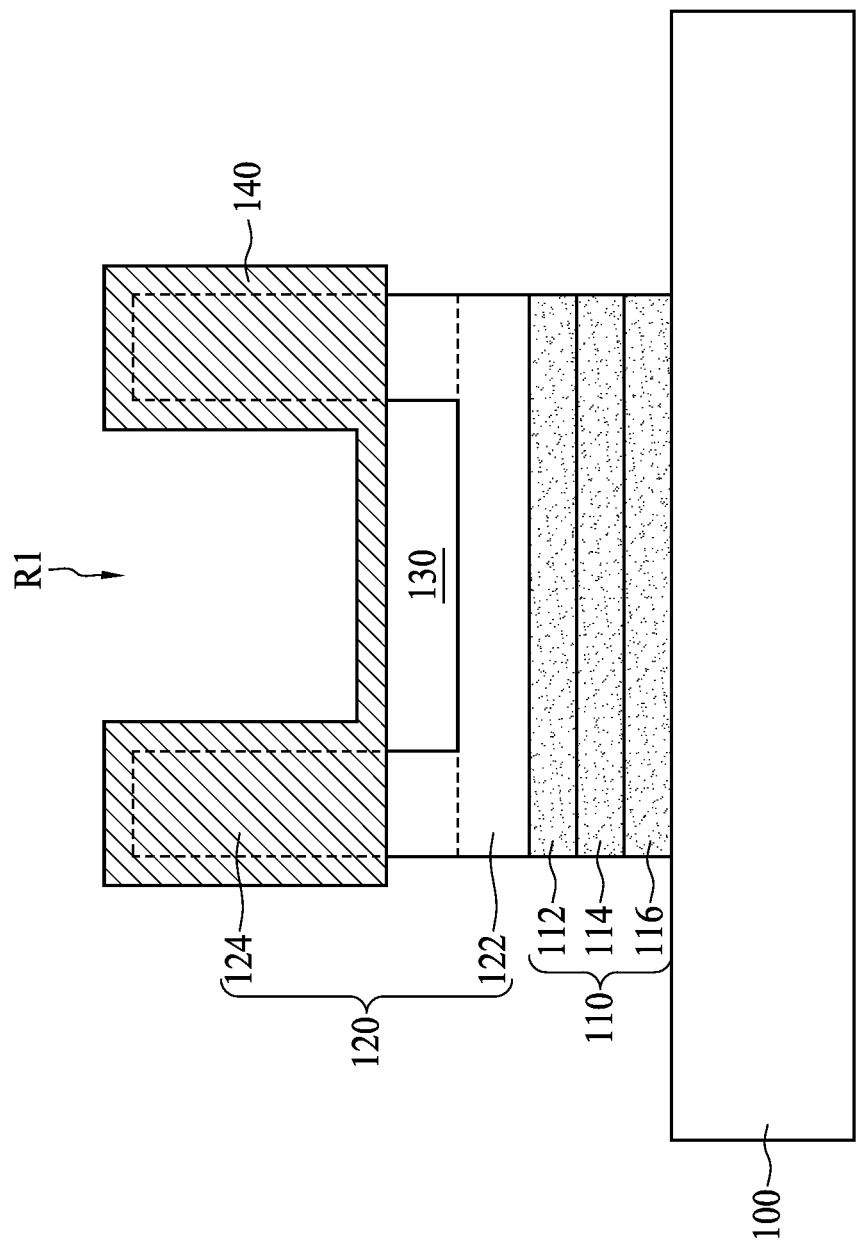
FIGS. 13 to 14 are schematic cross-sectional view showing sequential fabrication stages according to the method in FIG. 3, in accordance with some embodiments of the present disclosure.
Figure 14:
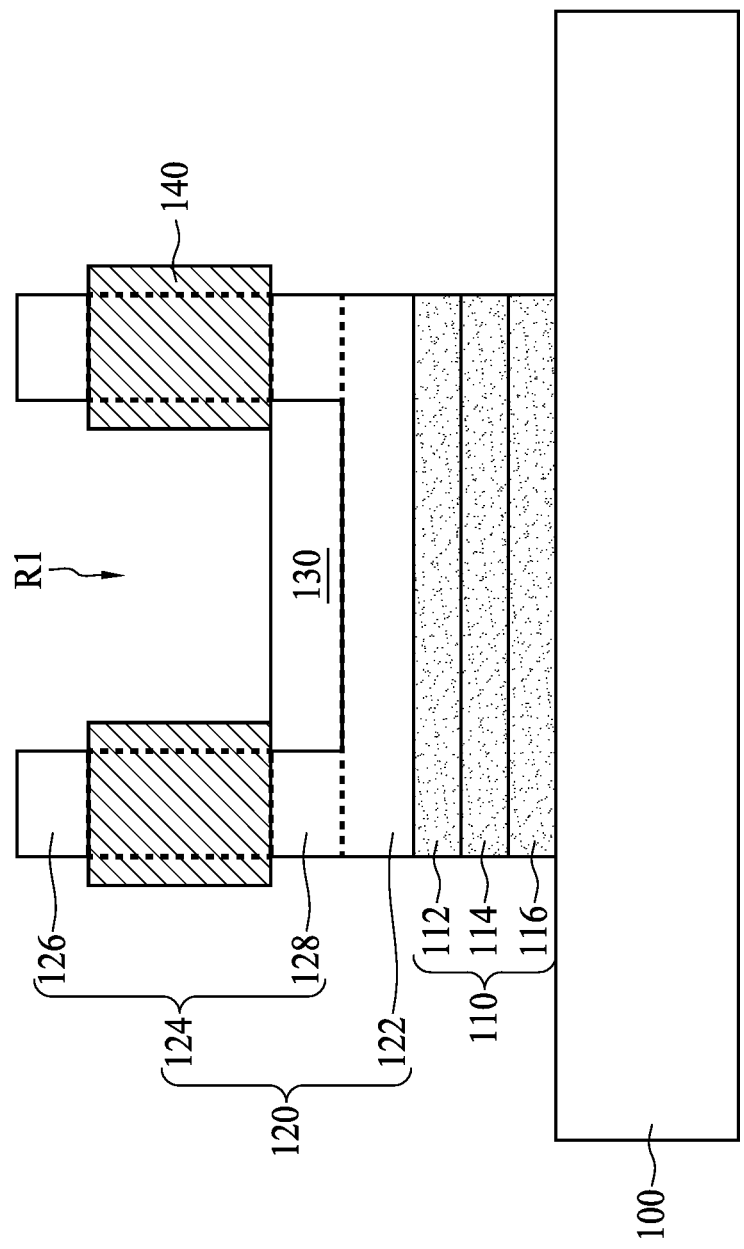

With reference to FIGS. 13 to 14, a lining process is performed on the channel structure 120 according to step S111 in FIG. 3. Referring to FIG. 13, in some embodiments, first, a lining material 140 is formed to conformally cover the vertical members 124 and the first oxide 130. In some embodiments, the lining material 140 may be formed using a CVD process. Preferably, the lining material 140 is formed using an atomic layer deposition (ALD) process to allow for formation of a highly conformal lining material having a more uniform thickness. In some embodiments, the lining material 140 includes compact silicon oxide ($SiO_2$) or silicon nitride ($Si_3N_4$).

Next, referring to FIG. 14, portions of the lining material 140 are removed to expose the top portion of the vertical member 124. As a result, the formed lining material 140 is lined on sidewalls of the vertical member 124 of the channel structure 120. In addition, the lining material 140 encircles a portion of the vertical member 124 and partially covers the first oxide 130. In some embodiments, the vertical member 124 includes a first portion 126 and a second portion 128, respectively disposed above and below the lining material 140.

Figure 15:
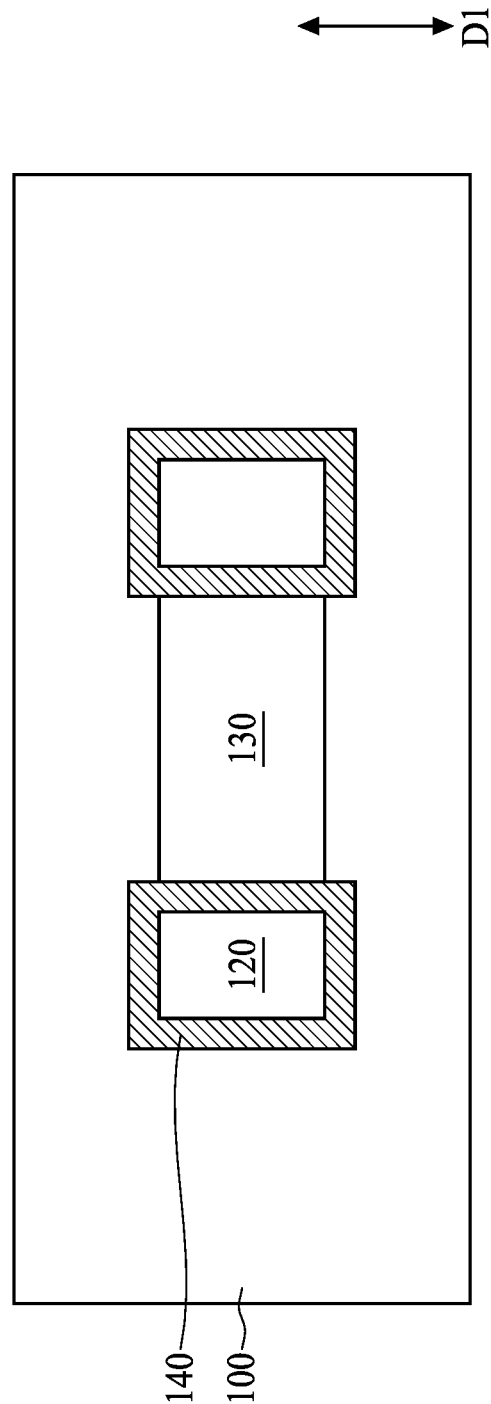
FIG. 15 is a schematic plan view of FIG. 14, in accordance with some embodiments of the present disclosure.

FIG. 15 is a schematic plan view of FIG. 14, in accordance with some embodiments of the present disclosure. In some embodiments, the lining material 140 is in the form of a hollow column encircling a waist of the vertical member 124. In some embodiments, the bottom surface of the lining material 140 is coplanar with the top surface of the first oxide 130. In FIG. 15, a portion of the first oxide 130 is covered by the lining material 140, and thus is not shown in the plan view.

Figure 16:
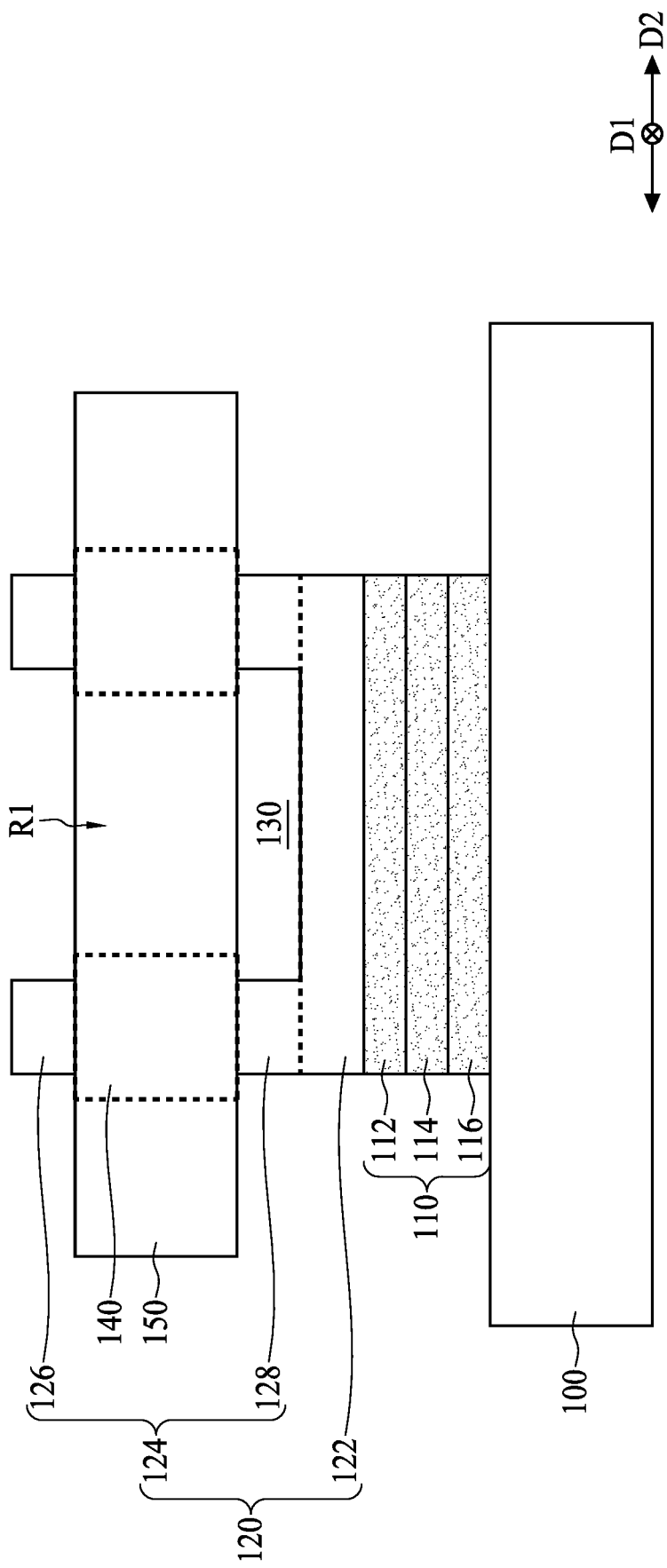
FIG. 16 is a schematic cross-sectional view showing a sequential fabrication stage according to the method in FIG. 3, in accordance with some embodiments of the present disclosure.

With reference to FIG. 16, a word line formation process is performed on the channel structure 120 according to step S113 in FIG. 3. The word line formation process may include at least a lithographic process, an etching process and a deposition process known in the art. In some embodiments, a word line 150 is formed to enclose a portion of the vertical member 124 encircled by the lining material 140. The word line 150 is disposed to cover the first oxide 130 and partially fills the ditch R1. In some embodiments, the word line 150 extends along a second direction D2 substantially orthogonal to the first direction D1. In some embodiments, a width of the word line 150 is substantially 1F, wherein F is a minimum feature size. In addition, the distance from a center of the word line 150 to a center of an adjacent word line (not shown) over the substrate 100 is substantially 2F. The word line 150 may be formed using a method such as a PVD process, a CVD process, a sputtering process or an electroplating process. In some embodiments, the word line 150 includes various conductive materials such as aluminum (Al), copper (Cu), tungsten (W), titanium (Ti) or titanium nitride (TiN). In addition, the word line 150 may be electrically coupled to the cell capacitor 110. In some embodiments, a top surface of the word line 150 is coplanar with a top surface of the lining material 140. In addition, a bottom surface of the word line 150 is coplanar with a bottom surface of the lining material 140 and a top surface of the first oxide 130. In FIG. 16, a sidewall of the lining material 140 is covered by the word line 150, and thus is not shown in the cross-sectional view.

Figure 17:
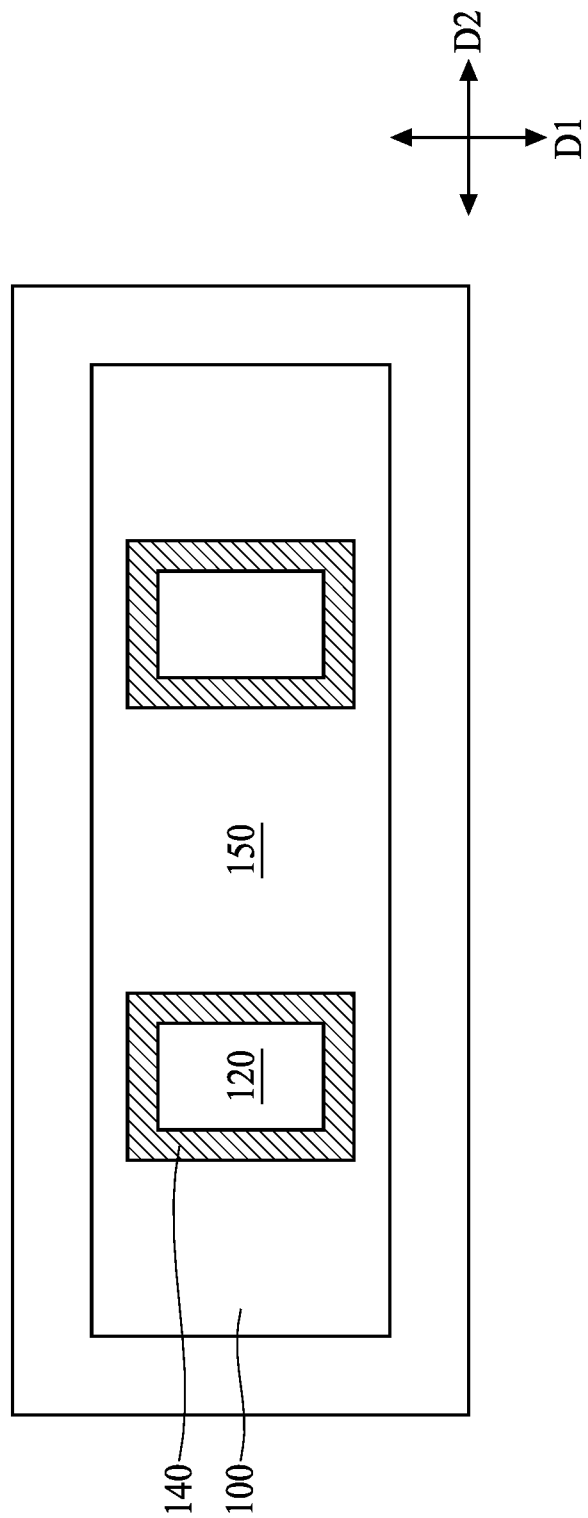
FIG. 17 is a schematic plan view of FIG. 16, in accordance with some embodiments of the present disclosure.

FIG. 17 is a schematic plan view of FIG. 16, in accordance with some embodiments of the present disclosure. In some embodiments, the lining material 140 is interposed between the word line 150 and the channel structure 120. In addition, the word line 150 passes through the vertical members 124 of the channel structure 120. In some embodiments, when a voltage is applied to the word line 150, the compact silicon oxide ($SiO_2$) or silicon nitride ($Si_3N_4$) of the lining material 140 can prevent the word line 150 from leaking current to the channel structure 120.

FIGS. 18A to 18C are schematic plan views of a plurality of channel structures 120 coupled by the word line 150, in accordance with some embodiments of the present disclosure. In FIGS. 18A to 18C, only the vertical members 124 of the channel structure 120, the ditch R1 and the word line 150 are shown, with the other elements omitted for the purpose of clarity. In some embodiments, multiple channel structures 120 are disposed over the substrate 100, wherein each channel structure 120 includes a ditch R1 therein. In addition, the word line 150 is configured to partially surround sidewalls of the channel structure 120.

Referring to FIG. 18A, which is similar to FIG. 17, the word line 150 passes through each pair of the vertical members 124 and extends along the second direction D2. In some embodiments, a pitch P1 is present among the channel structures 120, wherein the pitch P1 equals the distance from a center of one of the channel structures 120 to a center of an adjacent channel structure 120. In some embodiments, the pitch P1 is equal to 2F, wherein F is substantially a width of a bit line which will subsequently be formed.

FIG. 18B is similar to FIG. 18A with an only difference being that the ditch R1 extends along the second direction D2 instead of along the first direction D1. Specifically, the word line 150 is configured to be parallel to the ditch R1. In some embodiments, the arrangement shown in FIG. 18B may be formed by adjusting step S107 in FIG. 3. For example, the channel material 120A in FIG. 9 is cut at an orthogonal angle when the recess formation process is performed to form the channel structure 120 in FIG. 10. In other embodiments, the arrangement shown in FIG. 18B may also be formed by adjusting step S113 in FIG. 3. For example, the word line 150 in FIG. 16 is formed along the first direction D1 instead of along the second direction D2.

Referring to FIG. 18C, which is similar to FIGS. 18A and 18B, in some embodiments, the ditch R1 may extend along any one direction over the substrate 100. For example, the ditch R1 can be configured to extend along a third direction D3 substantially different from the first direction D1 and the second direction D2. In some embodiments, the third direction D3 forms a predetermined angle θ with respect to the second direction D2, wherein the predetermined angle θ is less than 90 degrees. In some embodiments, the arrangement shown in FIG. 18C may be formed by adjusting step S107 or step 113 in FIG. 3.

Figure 19:
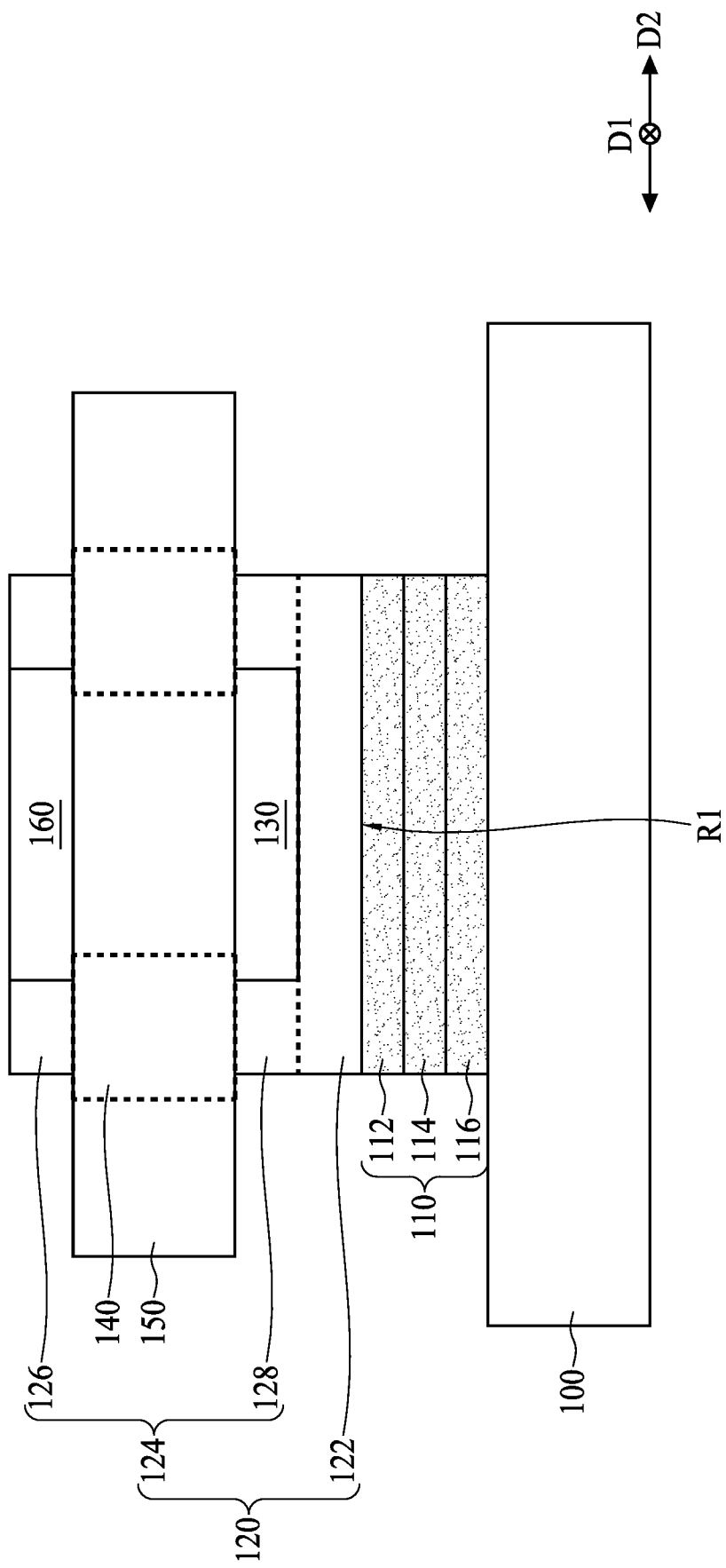
FIG. 19 is a schematic cross-sectional view showing a sequential fabrication stage according to the method in FIG. 3, in accordance with some embodiments of the present disclosure.

With reference to FIG. 19, a second deposition process is performed on the channel structure 120 according to step S115 in FIG. 3. In some embodiments, a second oxide 160 is formed to fill the ditch R1. Specifically, the second oxide 160 is deposited on a portion of the word line 150 in the ditch R1 and over the first oxide 130 within the channel structure 120. After the ditch R1 is filled, a chemical mechanical planarization (CMP) process may be performed on the second oxide 160 such that the top surface of the second oxide 160 does not protrude from the top surface of the vertical member 124. In some embodiments, the top surface of the second oxide 160 is coplanar with the top surface of the channel structure 120. The second oxide 160 may be formed using methods such as an LPCVD process or a PECVD process. In some embodiments, the second oxide 160 is silicon oxide ($SiO_2$). In some embodiments, the second oxide 160 provides additional oxygen atoms to the channel structure 120 via the formation of metal-oxygen (M-O) bonds between the channel structure 120 and the second oxide 160.

Figure 20:
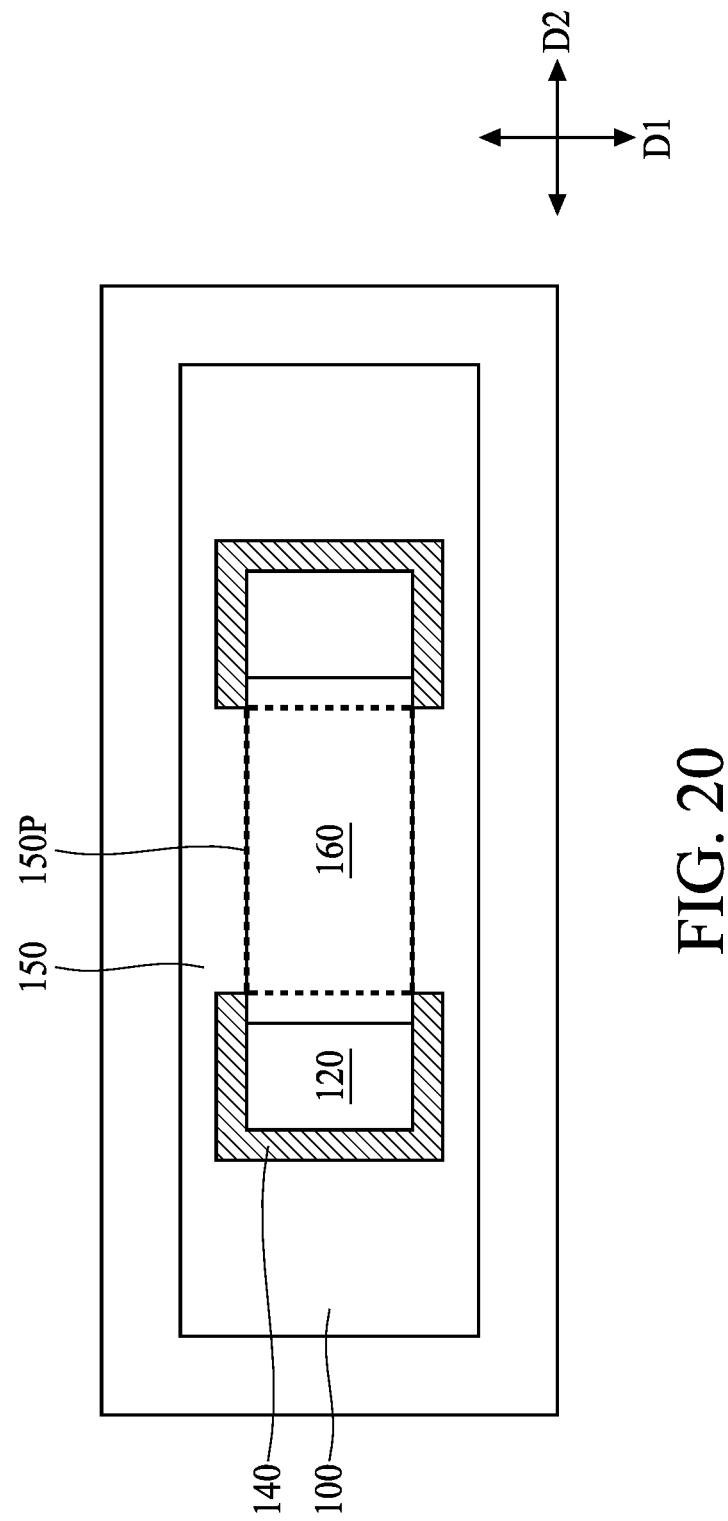
FIG. 20 is a schematic plan view of FIG. 19, in accordance with some embodiments of the present disclosure.

FIG. 20 is a schematic plan view of FIG. 19, in accordance with some embodiments of the present disclosure. In some embodiments, the second oxide 160 is interposed between the vertical members 124 of the channel structure 120. In addition, the second oxide 160 covers a portion of the lining material 140 in the ditch R1. At such time, a portion 150P of the word line 150 is sandwiched between the first oxide 130 and the second oxide 160. Moreover, the portion 150P is sandwiched between the vertical members 124 encircled by the lining material 140.

Figure 21:
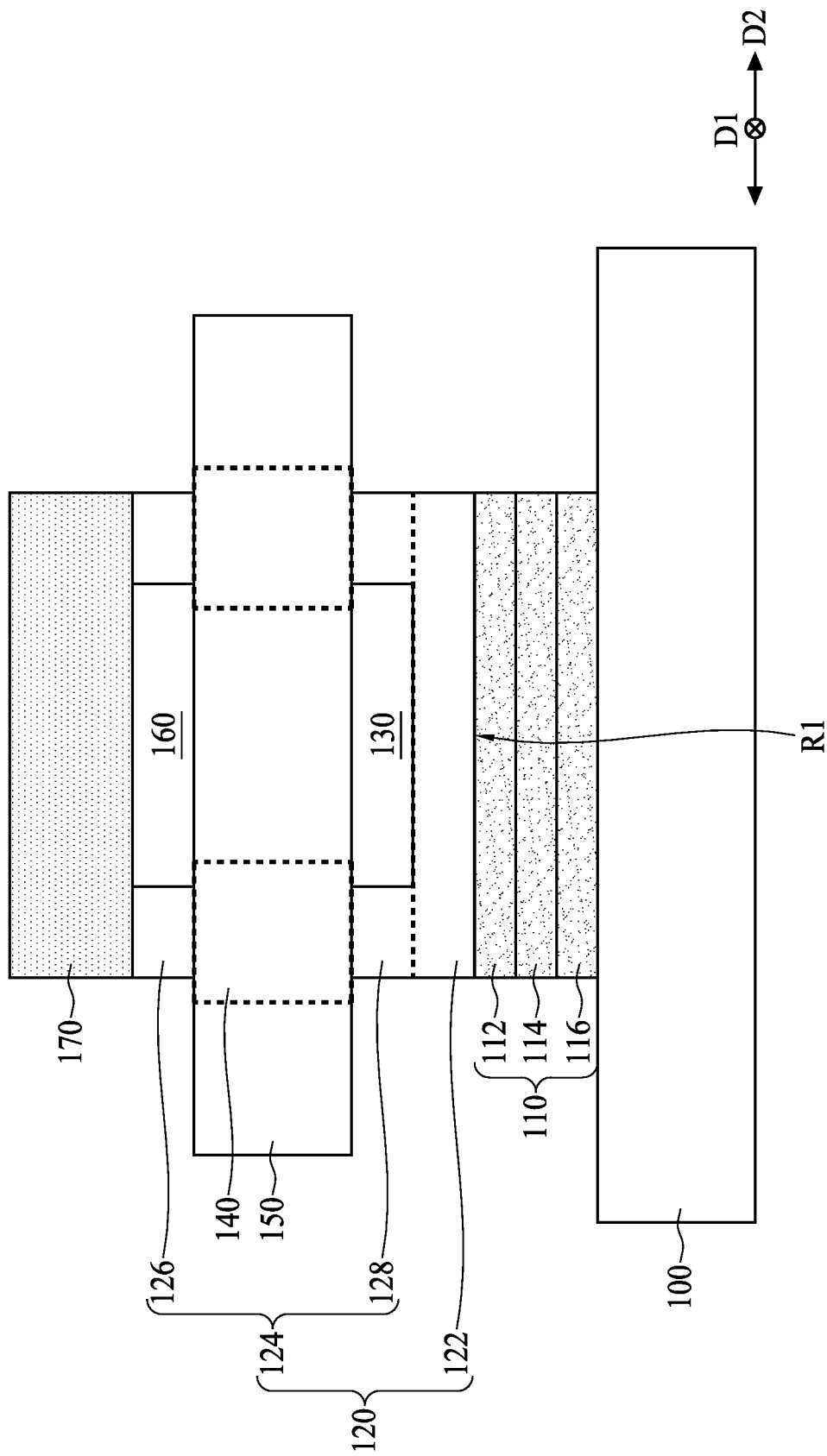
FIG. 21 is a schematic cross-sectional view showing a sequential fabrication stage according to the method in FIG. 3, in accordance with some embodiments of the present disclosure.

With reference to FIG. 21, a bit line formation process is performed on the channel structure 120 according to step S117 in FIG. 3. The bit line formation process may include at least a lithographic process, an etching process and a deposition process known in the art. In some embodiments, a bit line 170 is formed over the channel structure 120. In addition, the bit line 170 completely covers the second oxide 160 within the ditch R1. In some embodiments, the bit line 170 extends along the first direction D1. That is, the bit line 170 is configured to be parallel to the ditch R1 and orthogonal to the word line 150. The bit line 170 may be formed using methods such as a PVD process, a CVD process, a sputtering process or an electroplating process. In some embodiments, the bit line 170 includes various conductive materials such as metals or polysilicon. Preferably, the bit line 170 is a metal alloy, such as tungsten silicide (WSi). In addition, the bit line 170 may be electrically coupled to the word line 150 and the cell capacitor 110. The bit line 170 may be used to transmit a signal to the cell capacitor 110 so that data stored in the cell capacitor 110 can be read, or the signal can be stored as data and written in the cell capacitor 110. At such time, a first semiconductor structure 200 is generally formed.

Figure 22:
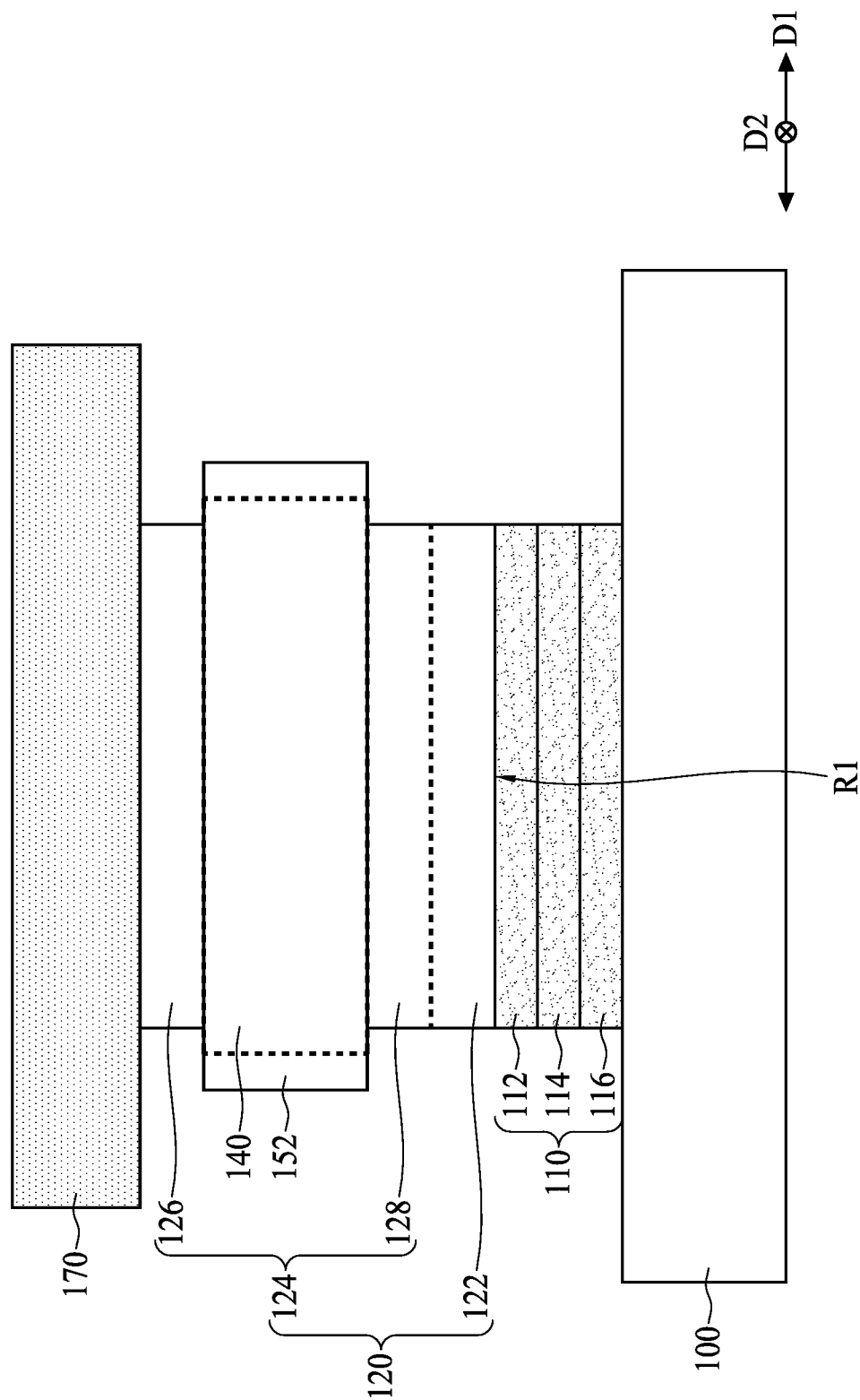
FIG. 22 is another schematic cross-sectional view taken along a second direction of FIG. 21, in accordance with some embodiments of the present disclosure.

FIG. 22 is another schematic cross-sectional view taken along the second direction D2 of FIG. 21, in accordance with some embodiments of the present disclosure. In some embodiments, the first portion 126 and the second portion 128 of the vertical member 124 of the channel material 120 may function as either a source or drain terminal of a vertically-oriented transistor. That is, when the first portion 126 functions as either a source terminal, the second portion 128 functions as a drain terminal, and vice versa. In some embodiments, the word line 150 includes a gate portion 152, disposed on the lining material 140. The gate portion 152 may function as a gate terminal of the transistor. In some embodiments, the first portion 126, the second portion 128 and the gate portion 152 may form a cell transistor 180 used to control the word line 150. In addition, the lining material between the gate portion 152 and the vertical member 124 may function as a gate dielectric layer that separates the gate terminal of the cell transistor 180 from the underlying source and drain terminals. In addition, the gate dielectric layer may prevent the gate terminal from leaking current. In some embodiments, the cell transistor 180 is a VGT or a vertical pillar transistor (VPT).

Figure 23:
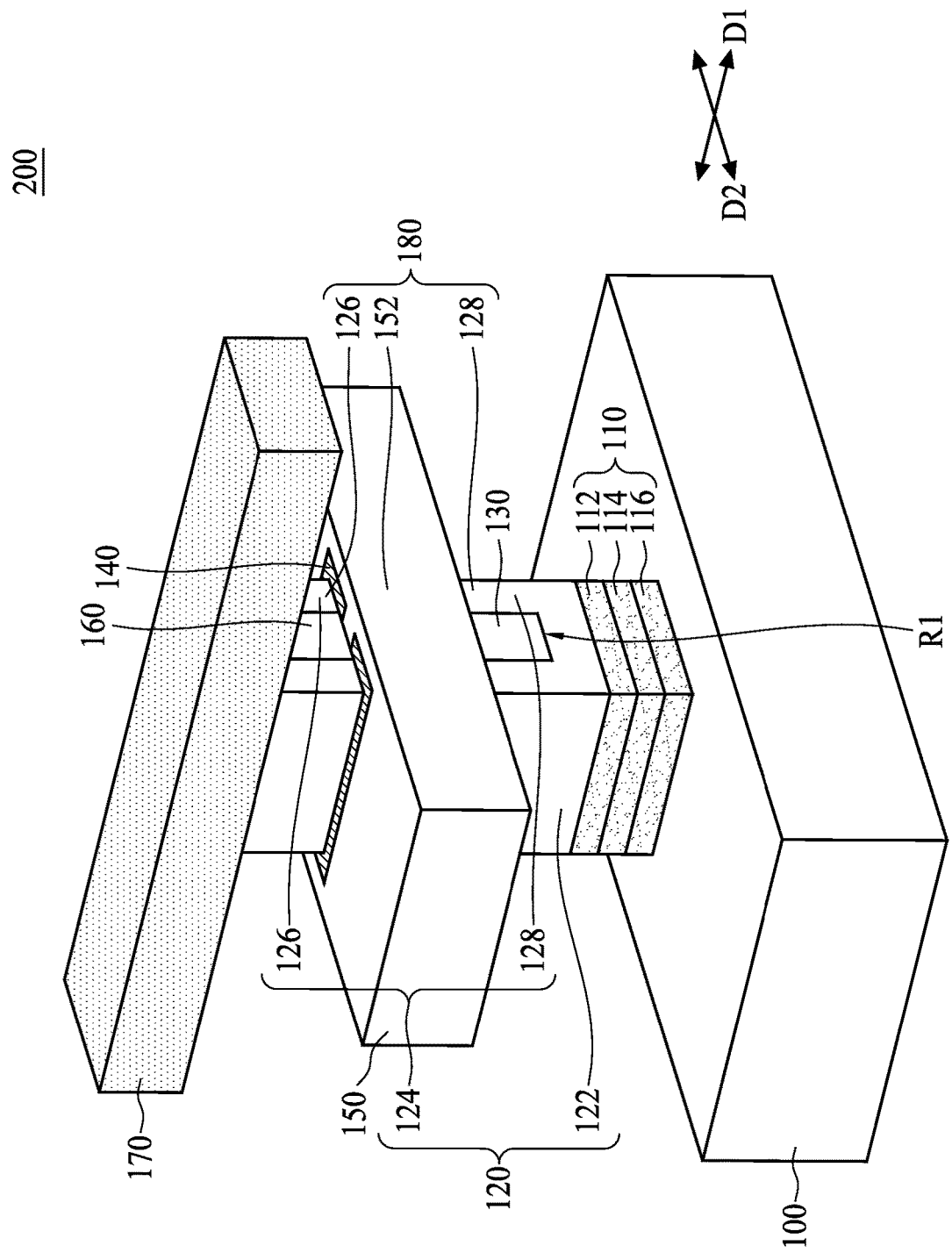
FIG. 23 is a schematic perspective view of FIG. 21, in accordance with some embodiments of the present disclosure.

FIG. 23 is a schematic perspective view of FIG. 21, in accordance with some embodiments of the present disclosure. In some embodiments, the cell capacitor 110 is located below the intersection of the word line 150 and the bit line 170. The cell transistor 180 acts as a switch for the cell capacitor 110. That is, the cell transistor 180 can control the charging and discharging of the cell capacitor 110. In some embodiments, the first portion 126 is electrically connected to the bit line 170, and the second portion 128 is electrically coupled to the cell capacitor 110 via the horizontal member 122. As a result, the word line 150 interposed between the first portion 126 and the second portion 128 can be electrically coupled to the bit line 170 and the cell capacitor 110 via the channel structure 120. In some embodiments, multiple word lines 150 and multiple bit lines 170 orthogonal to the word lines 150 form a memory array. The memory array may substantially form a dynamic random access memory (DRAM) with a $4F^2$ layout.

Figure 24:
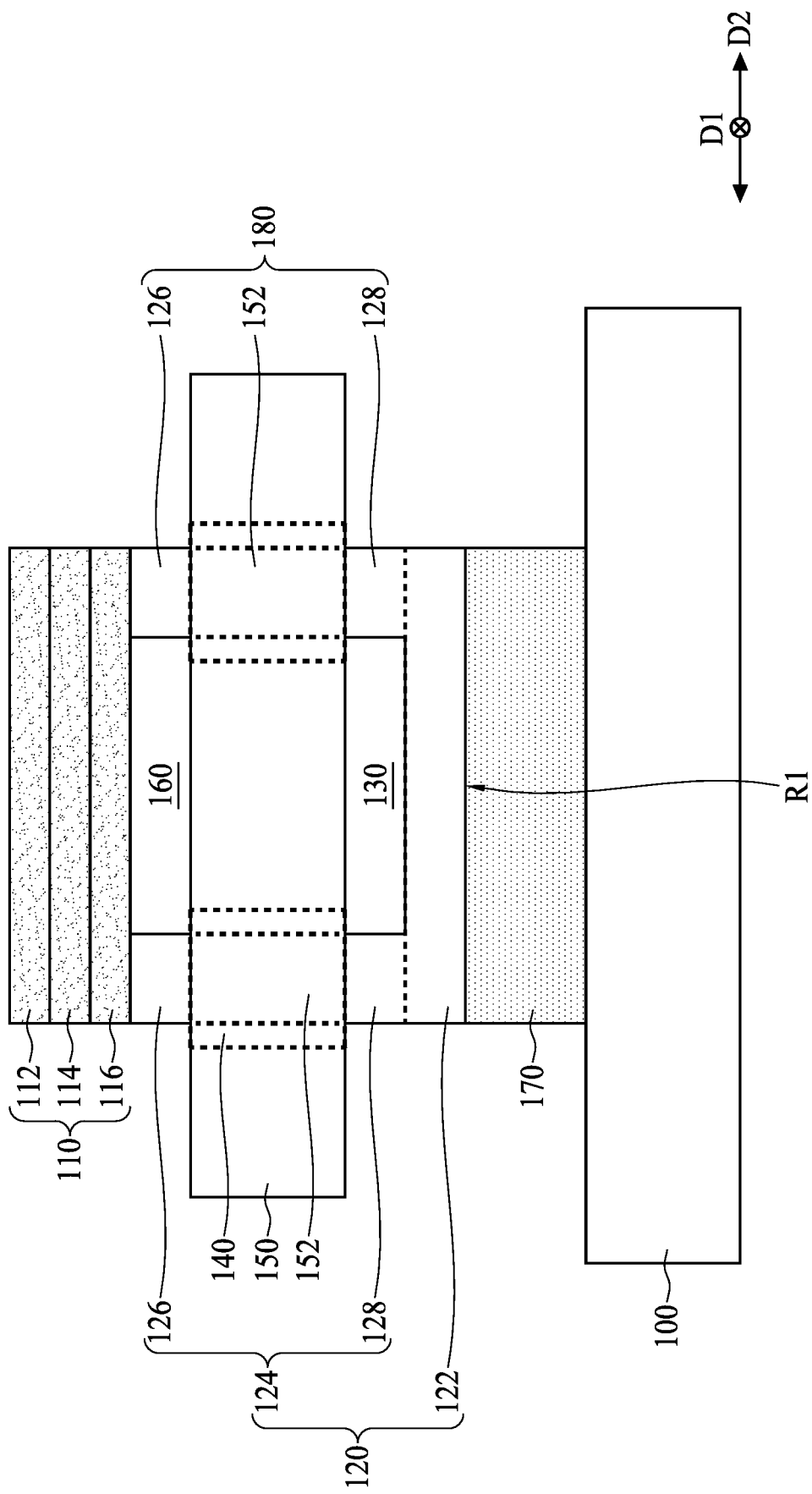
FIG. 24 is a schematic cross-sectional view of a second semiconductor structure, in accordance with some embodiments of the present disclosure.

In some embodiments, a capacitor-last process can also be performed according to the modification of the method 200. FIG. 24 is a schematic cross-sectional view of a second semiconductor structure 300, in accordance with some embodiments of the present disclosure. The second semiconductor structure 300 is similar to the first semiconductor structure 200 with an only difference being that the bit line 170 is formed prior to the formation of the cell capacitor 110. At such time, the bit line 170 is formed on the substrate 100 and the cell capacitor 110 is located over the intersection of the word line 150 and the bit line 170.

In some embodiments, the first semiconductor structure 200 and the second semiconductor structure 300 can be encapsulated by the interlayer dielectric. In some embodiments, the interlayer dielectric does not need to be completely formed all at one time. For example, the formation of the interlayer dielectric may include, but is not limited to, the following steps. First, after the cell capacitor 110 is formed, the interlayer dielectric may be deposited to a level that is coplanar with the top surface of the cell capacitor 110. Next, after the channel structure 120 is formed, the interlayer dielectric may be deposited to a level that is coplanar with the first oxide 130. Subsequently, after the word line 150 is formed, the interlayer dielectric may be deposited to a level that is coplanar with the channel structure 120.

In the present disclosure, a semiconductor structure including a channel structure is provided. The channel structure and a word line may together form a VGT in the semiconductor structure. The semiconductor structure includes non-silicon-based materials such as ZnO, IZO, ITZO, IGZO and the like, which have higher band gaps compared with that of pure silicon. In general, the non-silicon-based materials are oxygen-rich such that they can provide a great amount of oxygen vacancies. The oxygen vacancies supply the needed free carriers for electrical conduction of a metal-oxide semiconductor. However, high-temperature processes might decrease the content of the oxygen vacancies and further impact electrical properties of the metal-oxide semiconductor.

Therefore, the channel structure in the present disclosure is formed to have a horizontal member and a pair of vertical members separated by a ditch. Silicon oxide ($SiO_2$) is deposited in the ditch to contact the channel structure. At such time, when the channel structure undergoes high-temperature processes and its oxygen vacancies are lost, the silicon oxide ($SiO_2$) can supplement the lost oxygen vacancies via the formation of metal-oxygen (M-O) bonds between the channel structure and the additionally-provided oxygen atoms. In addition, the thermal stability of the channel structure can be improved by the addition of oxygen atoms.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of fabricating semiconductor structure, comprising:
    providing a substrate;
    forming a cell capacitor over the substrate;
    forming a channel structure over the cell capacitor, wherein the channel structure comprises a horizontal member and at least two separated vertical members extending from the horizontal member;
    forming a lining material, surrounding the at least two vertical members;
    forming a word line, enclosing the at least two vertical members; and
    forming a bit line over the channel structure.

2. The method according to claim 1, wherein the channel structure comprises amorphous silicon, doped silicon, indium oxide ($In_2O_3$), gallium oxide ($Ga_2O_3$), zinc oxide (ZnO), indium zinc oxide (IZO), indium tin oxide (ITO), indium tin zinc oxide (ITZO) or indium gallium zinc oxide (IGZO).

3. The method according to claim 1, wherein the lining material includes compact silicon oxide ($SiO_2$) or silicon nitride ($Si_3N_4$).

4. The method according to claim 1, wherein the channel structure is substantially a U-shaped structure.

5. The method according to claim 1, wherein the at least two vertical members extend along a first direction and the word line extends along a second direction substantially orthogonal to the first direction and wherein the bit line extends along the first direction.

6. The method according to claim 1, wherein the lining material is interposed between the word line and the channel structure.

7. The method according to claim 1, wherein the word line passes through the at least two vertical members of the channel structure.

8. The method according to claim 1, wherein the word line and the bit line form a memory array, wherein the memory array has a layout of four square feature size ($4F^2$).

9. The method according to claim 1, further comprising:

forming a first oxide between the at least two vertical members; and forming a second oxide over the first oxide and between the at least two vertical members.

10. The method according to claim 9, wherein the first oxide and the second oxide include silicon oxide ($SiO_2$).

11. The method according to claim 9, wherein the lining material partially covers the first oxide, and the second oxide partially covers the lining material.

12. The method according to claim 9, wherein a portion of the word line is sandwiched between the first oxide and the second oxide and between the at least two vertical members encircled by the lining material.

13. The method according to claim 9, wherein the second oxide is interposed between the at least two vertical members of the channel structure.

14. The method according to claim 9, wherein one of the at least two vertical members includes a first portion and a second portion, respectively disposed above and below the lining material.

15. The method according to claim 14, wherein the first portion is electrically connected to the bit line and the second portion is electrically coupled to the cell capacitor via the horizontal member.

16. The method according to claim 15, wherein the word line is interposed between the first portion and the second portion and electrically coupled to the bit line and the cell capacitor via the channel structure.

17. A method of fabricating semiconductor structure, comprising:

providing a substrate;

forming a bit line over the substrate;

forming a channel structure over the bit line, wherein the channel structure comprises a horizontal member and at least two separated vertical members extending from the horizontal member;

forming a lining material surrounding the at least two vertical members;

forming a word line, enclosing the at least two vertical members; and forming a cell capacitor over the channel structure.

18. A method of fabricating a semiconductor structure, comprising:

providing a substrate;

forming a cell capacitor over the substrate;

forming a channel material over the cell capacitor;

cutting the channel material to form a channel structure, wherein the channel structure comprises a horizontal member and at least two vertical members separated by a ditch on the horizontal member;

forming a lining material on sidewalls of the at least two vertical members;

forming a word line to enclose the at least two vertical members encircled by the lining material, and partially fill the ditch; and forming a bit line over the channel structure.

19. The method according to claim 18, wherein after the forming of the channel structure, a first oxide is formed in the ditch.

20. The method according to claim 19, wherein after the forming of the word line, a second oxide is formed on the word line in the ditch and over the first oxide.

* * * * *